US010510460B2

(12) United States Patent
Koizumi et al.

(10) Patent No.: US 10,510,460 B2
(45) Date of Patent: Dec. 17, 2019

(54) COMPOSITION, LAMINATE, METHOD OF MANUFACTURING LAMINATE, TRANSISTOR, AND METHOD OF MANUFACTURING TRANSISTOR

(71) Applicant: NIKON CORPORATION, Tokyo (JP)

(72) Inventors: Shohei Koizumi, Atsugi (JP); Takashi Sugizaki, Yokohama (JP); Kenji Miyamoto, Yokohama (JP); Yusuke Kawakami, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 1 day.

(21) Appl. No.: 15/599,078

(22) Filed: May 18, 2017

(65) Prior Publication Data
US 2017/0256331 A1 Sep. 7, 2017

Related U.S. Application Data

(60) Division of application No. 14/748,927, filed on Jun. 24, 2015, now abandoned, which is a continuation of application No. PCT/JP2014/050058, filed on Jan. 7, 2014.

(30) Foreign Application Priority Data

Jan. 7, 2013 (JP) .................. 2013-000631

(51) Int. Cl.
H01B 3/46 (2006.01)
H01L 51/00 (2006.01)
G03F 7/004 (2006.01)
G03F 7/20 (2006.01)
G03F 7/038 (2006.01)
G03F 7/075 (2006.01)
G03F 7/40 (2006.01)
C08L 63/00 (2006.01)
H01L 51/05 (2006.01)
H01L 21/02 (2006.01)
C08G 59/32 (2006.01)
C08G 59/62 (2006.01)
C08G 59/68 (2006.01)

(52) U.S. Cl.
CPC .......... H01B 3/46 (2013.01); C08G 59/3254 (2013.01); C08G 59/621 (2013.01); C08G 59/687 (2013.01); C08L 63/00 (2013.01); G03F 7/004 (2013.01); G03F 7/038 (2013.01); G03F 7/0752 (2013.01); G03F 7/0755 (2013.01); G03F 7/20 (2013.01); G03F 7/40 (2013.01); H01L 21/02126 (2013.01); H01L 51/0002 (2013.01); H01L 51/0015 (2013.01); H01L 51/0023 (2013.01); H01L 51/052 (2013.01); H01L 51/0545 (2013.01); Y10T 428/31663 (2015.04)

(58) Field of Classification Search
CPC .......... C08G 77/14; H01B 3/46; H01L 51/052
See application file for complete search history.

(56) References Cited

U.S. PATENT DOCUMENTS

| 5,206,312 | A | 4/1993 | Liao et al. |
| 5,260,133 | A | 11/1993 | Brandt et al. |
| 5,946,551 | A | 8/1999 | Dimitrakopoulos et al. |
| 6,232,157 | B1 | 5/2001 | Dodabalapur et al. |
| 7,473,520 | B2 | 1/2009 | Ishikura et al. |
| 2002/0019081 | A1* | 2/2002 | Denis ................ H01L 29/66765 438/149 |
| 2003/0235788 | A1 | 12/2003 | Choi |
| 2005/0279995 | A1 | 12/2005 | Shin et al. |
| 2014/0326980 | A1* | 11/2014 | Suzuki ................ C08G 77/045 257/40 |

FOREIGN PATENT DOCUMENTS

| EP | 0 391 162 A2 | 10/1990 |
| EP | 391162 | * 10/1990 |
| EP | 0 703 236 A1 | 3/1996 |
| EP | 2259355 | * 2/2013 |
| JP | 3-128975 | 5/1991 |
| JP | 6-107831 | 4/1994 |
| JP | 8-104706 | 4/1996 |
| JP | 2001-209183 | 8/2001 |
| JP | 2004-29812 | 1/2004 |

(Continued)

OTHER PUBLICATIONS

NXP (Freescale Semiconductor, Inc. 1993, 2009)(https://www.nxp.com/docs/en/application-note/AN211A.pdf).*
PCT International Search Report dated Apr. 1, 2014 in corresponding International Patent Application No. PCT/JP2014/050058.
Written Opinion of the International Searching Authority dated Apr. 1, 2014 in corresponding International Patent Application No. PCT/JP2014/050058.
Restriction Requirement dated Apr. 19, 2016 in related U.S. Appl. No. 14/748,927.

(Continued)

Primary Examiner — Kuo Liang Peng

(57) ABSTRACT

A method of manufacturing a laminate, transistor, and method of manufacturing transistor using a composition that includes an organic compound having a hydroxy group; a first cross-linking agent that is at least one organic silicon compound selected from the group including an organic silicon compound including a siloxane bond in the molecule and having three or more cyclic ether groups in the molecule, a chain organic silicon compound including two or more siloxane bonds in the molecule and having two or more cyclic ether groups in the molecule, a cyclic organic silicon compound including D unit in the molecule and having four or more cyclic ether groups bonded to a silicon atom of the D unit in the molecule, and a cyclic organic silicon compound including a T unit in the molecule and having two or more cyclic ether groups in the molecule; and a photocationic polymerization initiator.

26 Claims, 17 Drawing Sheets

(56) References Cited

FOREIGN PATENT DOCUMENTS

| | | |
|---|---|---|
| JP | 2006-28497 | 2/2006 |
| JP | 2006-152085 | 6/2006 |
| JP | 2007-514018 | 5/2007 |
| JP | 2009-173017 | 8/2009 |
| WO | WO 2005/054387 A2 | 6/2005 |
| WO | WO 2009/001850 A1 | 12/2008 |
| WO | 2013099460 * | 7/2013 |

OTHER PUBLICATIONS

Office Action dated Nov. 18, 2016 in related U.S. Appl. No. 14/748,927.
U.S. Appl. No. 14/748,927, filed Jun. 24, 2015, Shohei Koizumi et al., Nikon Corporation.
Japanese Office Action dated Jul. 4, 2017 in corresponding Japanese Patent Application No. 2014-555461.
Office Action dated Jan. 23, 2018, in corresponding Japanese Patent Application No. 2014-555461, 7 pgs.

* cited by examiner

COMPOSITION, LAMINATE, METHOD OF MANUFACTURING LAMINATE, TRANSISTOR, AND METHOD OF MANUFACTURING TRANSISTOR

CROSS-REFERENCE TO RELATED APPLICATIONS

This is a Divisional Application of U.S. application Ser. No. 14/748,927 filed Jun. 24, 2015, which is a Continuation Application of International Application No. PCT/JP2014/050058, filed on Jan. 7, 2014, which claims foreign priority on Japanese Patent Application No. 2013-000631, filed on Jan. 7, 2013. The contents of the aforementioned applications are incorporated herein by reference.

BACKGROUND

1. Field

The present invention relates to a composition, a laminate, a method of manufacturing a laminate, a transistor, and a method of manufacturing a transistor.

2. Description of Related Art

In the related art, a laminate of a conductive layer and an insulator layer has been used in various electronic circuits.

The laminate having such a laminated structure is used, for example, to achieve the miniaturization and high integration of electronic circuits. Specifically, this laminate is used for a printed circuit board, a condenser, a transistor, and the like, each having a multilayer wiring structure.

When forming the above laminate, wirings (conductive layers) to be laminated are insulated from each other by an insulator layer. As the insulator layer, any of an inorganic insulator and an organic insulator may be used (for example, refer to U.S. Pat. Nos. 5,946,551 and 6,232,157). Among these, the laminate using an organic insulator is advantageous, compared to a laminate using a conventional insulator layer using $SiO_2$ as a formation material, in that an insulator layer can be formed in a liquid phase and in that a laminated structure can be formed at a lower temperature without requiring a vacuum process.

In the laminate in which an organic insulator is used in an insulator layer, there is proposed a technology of patterning an insulator layer through a photoresist-free simple method by the combination of polyvinyl phenol (PVP) and an epoxy group-containing compound with a photopolymerization initiator (for example, refer to Japanese Unexamined Patent Application, First Publication No. 2006-28497).

SUMMARY

However, when a laminate is formed using a resin substrate, a developer used for patterning an insulator layer may dissolve or swell the resin substrate. When an alkaline solution is used as a developer, it is known that it is possible to prevent the resin substrate from being dissolved or swelled, but a material in use for an insulator layer developable by an alkaline solution has been limited.

An object of an aspect of the present invention is to provide a composition developable by an alkaline solution and capable of forming an insulator layer.

Another object of an aspect of the present invention is to provide a method of manufacturing a laminate using the composition, a manufactured laminate, a method of manufacturing a transistor, and a manufactured transistor.

A composition according to an aspect of the present invention includes:

(a) an organic compound having a hydroxy group;

(b) a first cross-linking agent that is at least one organic silicon compound selected from the group including (b-1) an organic silicon compound including a siloxane bond in the molecule and having three or more cyclic ether groups in the molecule, (b-2) a chain organic silicon compound including two or more siloxane bonds in the molecule and having two or more cyclic ether groups in the molecule, (b-3) a cyclic organic silicon compound including a siloxane unit (D unit) represented by $R^1R^2SiO_{2/2}$ in the molecule, any one of or both of $R^1$ and $R^2$ being a cyclic ether group, and having four or more cyclic ether groups bonded to a silicon atom of the D unit in the molecule, and (b-4) a cyclic organic silicon compound including a siloxane unit (T unit) represented by $R^3SiO_{3/2}$ in the molecule, $R^3$ being a cyclic ether group, and having two or more cyclic ether groups in the molecule; and (c) a photocationic polymerization initiator.

A method of manufacturing a laminate according to another aspect of the present invention includes: applying a solution containing the above-described composition over a conductive layer to form a coating film; selectively irradiating the coating film with light including light having an absorption wavelength of the photocationic polymerization initiator included in the coating film to form a latent image in the light-irradiated region of the coating film; and developing the coating film with an alkaline solution to form an insulator layer.

A laminate according to another aspect of the present invention includes: a conductive layer; and an insulator layer formed by cationic-polymerization of the above-described composition.

A method of manufacturing a transistor according to another aspect of the present invention includes: forming a gate electrode on a substrate; applying a solution including the above-described composition over the gate electrode to form a coating film; selectively irradiating the coating film with light including light having an absorption wavelength of a photocationic polymerization initiator included in the coating film to form a latent image in the light-irradiated region of the coating film; developing the coating film with an alkaline solution to form an insulator layer; and forming a source electrode and a drain electrode on the surface of a layer including the insulator layer.

A transistor according to another aspect of the present invention includes: a source electrode and a drain electrode; a gate electrode provided corresponding to a channel between the source electrode and the drain electrode; a semiconductor layer provided in contact with the source electrode and the drain electrode; and an insulator layer disposed between the source electrode and the gate electrode and between the drain electrode and the gate electrode, wherein the insulator layer is formed by cationic polymerization of the above-described composition.

According to an aspect of the present invention, it is possible to provide a composition developable by an alkaline solution and capable of forming an insulator layer. According to another aspect of the present invention, it is possible to provide a method of manufacturing a laminate using the composition, a manufactured laminate, a method of manufacturing a transistor, and a manufactured transistor.

DETAILED DESCRIPTION

First Embodiment

Figure 1A:
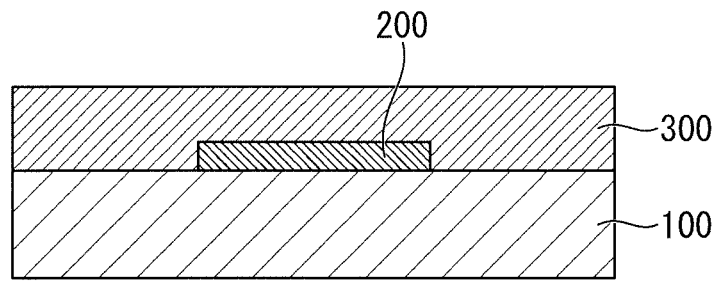
FIG. 1A is a process view showing a method of manufacturing a laminate according to a first embodiment.

Hereinafter, a first embodiment of the present invention will be described.

(Composition)

A composition of the present embodiment includes the following (a) to (c):

(a) an organic compound having a hydroxy group;

(b) a first cross-linking agent that is at least one organic silicon compound selected from the group including (b-1) an organic silicon compound including a siloxane bond in the molecule and having three or more cyclic ether groups in the molecule, (b-2) a chain organic silicon compound including two or more siloxane bonds in the molecule and having two or more cyclic ether groups in the molecule, (b-3) a cyclic organic silicon compound including a siloxane unit (D unit) represented by $R^1R^2SiO_{2/2}$ in the molecule, any one of or both of $R^1$ and $R^2$ being a cyclic ether group, and having four or more cyclic ether groups bonded to a silicon atom of the D unit in the molecule, and (b-4) a cyclic organic silicon compound including a siloxane unit (T unit) represented by $R^3SiO_{3/2}$ in the molecule, $R^3$ being a cyclic ether group, and having two or more cyclic ether groups in the molecule; and (c) a photocationic polymerization initiator.

Hereinafter, there will be described a case that the composition is a curable composition, but the composition of the present invention is not limited to the curable composition.

The curable composition of the present embodiment is soluble in an alkaline solution. As an alkaline solution, an alkaline developer which is commonly used in a field such as photolithography can be used. Examples of materials of the developer include an aqueous TMAH (tetramethylammonium hydroxide) solution and an aqueous NaOH (sodium hydroxide) solution.

Note that, the term "soluble in an alkaline solution" refers to that when a coating film formed in a film thickness of 1 μm is immersed in 2.38 mass % of an aqueous TMAH (tetramethylammonium hydroxide) at 25° C. for 2 minutes, the immersed portion of the coating film is completely dissolved and removed.

Further, the term "coating film completely dissolved" refers to that when the aqueous TMAH solution after the test is filtered by a membrane filter (pore size 0.1 μm), a solid form of the coating film is not visually confirmed on the membrane filter.

Further, the "cyclic ether group" refers to a group obtained by removing one hydrogen atom included in the cyclic ether. The one hydrogen atom to be removed may be an atom connected directly to the ring structure of the cyclic ether or may be an atom included in a substituent connected to the ring structure.

Further, the "siloxane bond" refers to a Si—O—Si bond, and the number of siloxane bonds refers to the number of oxygen atoms that constitute the siloxane bond. For example, in the case of the structure of Si—O—Si—O—Si, the number of siloxane bonds is 2.

Further, the "chain organic silicon compound" refers to an organic silicon compound in which the skeleton having the siloxane bond is chainlike.

Further, the "cyclic organic silicon compound" refers to an organic silicon compound in which the skeleton having a siloxane unit (D unit) represented by $R^1R^2SiO_{2/2}$ or a siloxane unit (T unit) represented by $R^3SiO_{3/2}$ constitutes the ring structure. The term "cyclic" includes "monocyclic", "polycyclic", "cross-linked structure", and "spirocyclic structure".

Hereinafter, a compound that constitutes a curable composition used in the method of manufacturing a laminate of the present embodiment will be described. It is determined whether the compound that constitutes the curable composition in the present specification is usable or unusable, not based on whether or not an individual compound is "soluble in an alkaline solution", but based on whether or not a curable composition constituted by the individual compound is "soluble in an alkaline solution".

As the organic compound (a), a commonly known organic compound can be used as long as the organic compound has an insulation property. When a high dielectric property in addition to the insulation property is required, for example, in a case where an insulator layer formed by using the curable composition is used for a gate insulator film of a transistor or a condenser, the organic compound (a) can include a phenolic hydroxy group. Examples of such an organic compound include polyvinyl phenol (PVP), and poly (2-hydroxyethyl methacrylate). Specifically, polyvinyl phenol (436224, manufactured by Sigma-Aldrich Corporation), and poly (2-hydroxyethyl methacrylate) (529265, manufactured by Sigma-Aldrich Corporation) can be used.

The cyclic ether group included in the first cross-linking agent (b) may be a group that has a ring opened by a cation under a cationic polymerization environment and that is bondable to the organic compound (a). Examples of such a group include a 3 to 4-membered oxa cycloalkyl group, or a group having such an oxa cycloalkyl group. The oxa cycloalkyl group may include a condensed ring structure.

Such an oxa cycloalkyl group can be a group having an epoxy ring as a three-membered ring or a group having an oxetanyl ring as a four-membered ring. Since the epoxy ring and the oxetanyl ring have strain in the ring structure, the epoxy ring and the oxetanyl ring have a high reactivity, and the ring is easily opened. Therefore, the epoxy ring and the oxetanyl ring are capable of forming a bond to the organic compound (a).

Examples of the cyclic ether group included in the first cross-linking agent (b) include: (1) a 3 to 4-membered oxa cycloalkyl group; (2) a group formed by substituting a 3 to 4-membered oxa cycloalkyl group for a hydrogen atom included in one group selected from the group including: a straight-chain, branched, or cyclic alkyl group of 1 to 20 carbon atoms; an alkoxyalkyl group formed by substituting a straight-chain, branched, or cyclic alkoxy group of 1 to 10 carbon atoms for a hydrogen atom included in a straight-chain, branched, or cyclic alkyl group of 1 to 10 carbon atoms; and an aromatic group; and (3) a condensed ring group of a 3 to 4-membered oxa cycloalkyl group and one selected from the group including: a straight-chain, branched, or cyclic alkyl group of 1 to 20 carbon atoms; an alkoxyalkyl group formed by substituting a straight-chain, branched, or cyclic alkoxy group of 1 to 10 carbon atoms for a hydrogen atom included in a straight-chain, branched, or cyclic alkyl group of 1 to 10 carbon atoms; and an aromatic group.

In the organic silicon compound (b-1) including a siloxane bond in the molecule and having three or more cyclic ether groups in the molecule, the cyclic ether groups may be identical to each other or may be different from each other.

In the chain organic silicon compound (b-2) including two or more siloxane bonds in the molecule and having two or more cyclic ether groups in the molecule, the cyclic ether groups may be identical to each other or may be different from each other. Further, in the chain organic silicon compound (b-2), the two or more siloxane bonds may be in a straight chain form or may have a branched structure.

Specific examples of such a chain organic silicon compound (b-2) can include a compound represented by Formula (B21) below, and a compound (Tris(glycidoxypropyldimethylsiloxy)phenylsilane (SIT8715.6, manufactured by Gelest Inc.) represented by Formula (B22) below.

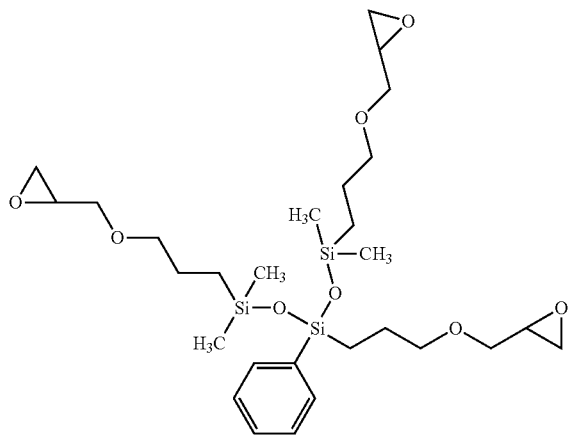

(B21)

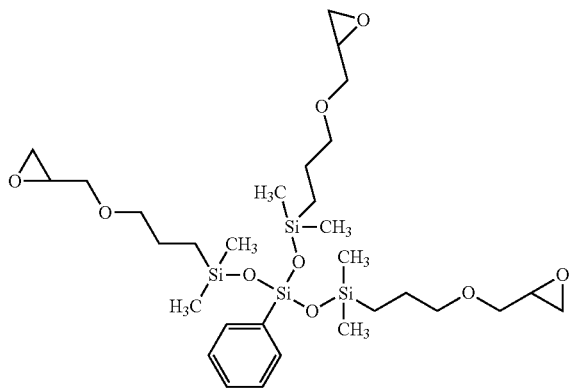

(B22)

In the cyclic organic silicon compound (b-3) including a siloxane unit (D unit) represented by $R^1R^2SiO_{2/2}$ in the molecule, any one of or both of $R^1$ and $R^2$ being a cyclic ether group, and having four or more cyclic ether groups bonded to a silicon atom of the D unit in the molecule, the cyclic ether groups may be identical to each other or may be different from each other. Further, in a case where a plurality of D units are included, $R^1$s included in the D units may be identical to each other or may be different from each other, and $R^2$s included in the D units may be identical to each other or may be different from each other.

In the cyclic organic silicon compound (b-3), the D units may be bonded to each other to form a monocyclic structure surrounded by a Si—O—Si bond, or may further include a siloxane unit of a T unit that does not have a cyclic ether group to thereby form a cage-shaped structure surrounded by a Si—O—Si bond. Further, in a case where the T unit is included, the cyclic organic silicon compound (b-3) may have a structure in which a silicon atom is not bonded to the other end of an oxygen atom that constitutes a Si—O bond and part of the cage-shaped structure is not surrounded by a Si—O—Si bond.

In the cyclic organic silicon compound (b-4) including a siloxane unit (T unit) represented by $R^3SiO_{3/2}$ in the molecule, $R^3$ being a cyclic ether group, and having two or more cyclic ether groups in the molecule, the cyclic ether groups may be identical to each other or may be different from each other. Further, in a case where a plurality of T units are included, $R^3$s included in the T units may be identical to each other or may be different from each other.

In the cyclic organic silicon compound (b-4), the T units may be bonded to each other to form a cage-shaped structure surrounded by a Si—O—Si bond, or in an unit structure of part of T units, a structure may be formed in which a silicon atom is not bonded to the other end of an oxygen atom that constitutes a Si—O bond and part of the cage-shaped structure is not surrounded by a Si—O—Si bond. Further, the cyclic organic silicon compound (b-4) may include a siloxane unit of a D unit.

A specific example of such a cyclic organic silicon compound (b-4) can include a compound (PSS-Octa[(3-glycidyloxypropyl)dimethylsiloxy]substituted (593869, manufactured by Sigma-Aldrich Corporation)) represented by Formula (B41) below.

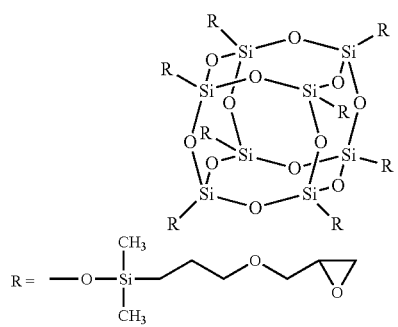

(B41)

As the first cross-linking agent (b), a cyclic organic silicon compound (b-3) or (b-4) in which Si—O bonds are aggregated is preferably used.

The photocationic polymerization initiator (c) is a compound that initiates the cationic polymerization reaction of a curable composition using the cationic species or Lewis acid generated by the absorption of light (for example, ultraviolet light) energy. As the photocationic polymerization initiators, known photocationic polymerization initiators, such as aromatic diazonium salts, aromatic sulfonium salts, aromatic iodonium salts, metallocene compounds, phosphonium salts, and silanol-aluminum complexes, can be used. These compounds may be used alone or in a mixture of two or more.

A specific example of the photocationic polymerization initiator (c) may include OMPH076 manufactured by Glest Inc., which is an aromatic sulfonium salt.

Here, in order to increase the reactivity of the photocationic polymerization initiator (c), a photosensitizer that accelerates the reaction of the photocationic polymerization initiator (c) by absorbing light and transferring the absorbed energy to the photocationic polymerization initiator (c) may be added to the curable composition.

The curable composition of the present embodiment may further include a second cross-linking agent (d) that is an organic compound having two or more cyclic ether groups. When the curable composition further includes the second cross-linking agent, it is possible to add physical properties due to the second cross-linking agent to an insulator, which will be formed, and the degree of freedom of design is enhanced.

For example, in order to improve insulation properties of the insulator to be formed and additionally improve the dielectric constant, the second cross-linking agent can be a compound having an aromatic ring and is preferably a compound represented by Formula (d1) below.

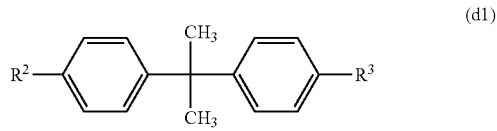

(d1)

($R^2$ and $R^3$ are each a cyclic ether group. $R^2$ and $R^3$ may be identical to each other or may be different from each other.)

The cyclic ether group represented as $R^2$ and $R^3$ can be a group formed by substituting a 3 to 4-membered oxa cycloalkyl group for a hydrogen atom included in one selected from the group including: a straight-chain, branched, or cyclic alkyl group of 1 to 20 carbon atoms; an alkoxyalkyl group formed by substituting a straight-chain, branched, or cyclic alkoxy group of 1 to 10 carbon atoms for a hydrogen atom included in a straight-chain, branched, or cyclic alkyl group of 1 to 10 carbon atoms; and an aromatic group.

The oxa cycloalkyl group included in the group represented as $R^2$ and $R^3$ can be a group having an epoxy ring that is a three-membered ring or a group having an oxetanyl ring that is a four-membered ring. Since the epoxy ring and the oxetanyl ring have strain in the ring structure, the epoxy ring and the oxetanyl ring have a high reactivity, and the ring is easily opened such that a cationic polymerization reaction occurs.

A specific example of the second cross-linking agent (d) can include a bisphenol A epoxy monomer (RE310S, manufactured by Nippon Kayaku Co., Ltd.) represented by Formula (d2) below.

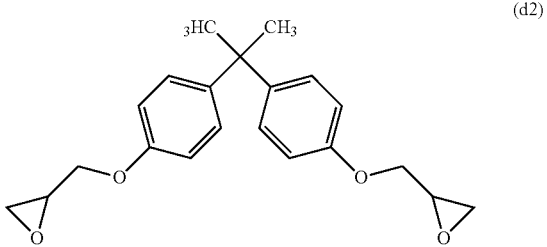

(d2)

In the curable composition of the present embodiment, the ratio of the sum of the mass of the first cross-linking agent (b) and the second cross-linking agent (d) to the total sum of the mass of the organic compound (a) having a hydroxy group, the first cross-linking agent (b), and the second cross-linking agent (d) can be 40 mass % to 90 mass %, and the ratio of the mass of the second cross-linking agent (d) to the total sum of (a), (b) and (d) can be 5 mass % to 30 mass %. Although most of second cross-linking agents (d) are insoluble in an alkaline solution, when such a combination is used, it is possible to add physical properties due to the second cross-linking agent to the insulator in a state where the entire curable composition is soluble in an alkaline solution.

The curable composition of the present embodiment may be used in combination with various fillers within a range that does not impair the advantages of the present invention. When the curable composition is used in combination with a filler, the curable composition functions as the binder of the filler, and physical properties due to the filler can be further imparted to an insulator, which will be formed.

Although most of such fillers are insoluble in an alkaline solution, when a coating film of a curable composition including a filler is immersed in an alkaline solution, the curable composition is dissolved in the alkaline solution. Thereby, the support of the filler is lost, and the filler is dispersed in the alkaline solution. Accordingly, it is possible to remove even a composition using a curable composition with a filler by the alkaline solution.

The curable composition as described above is developable by an alkaline solution and is capable of forming an insulator layer. Therefore, it is possible to reduce a manufacturing load.

(Manufacturing Method of Laminate, Laminate)

Hereinafter, a method of manufacturing a laminate according to the present embodiment and a laminate will be described with reference to FIGS. 1A to 1C. In all the following drawings, for ease of understanding the drawings, dimensions, proportions, and the like of each component are appropriately varied.

Figure 1B:
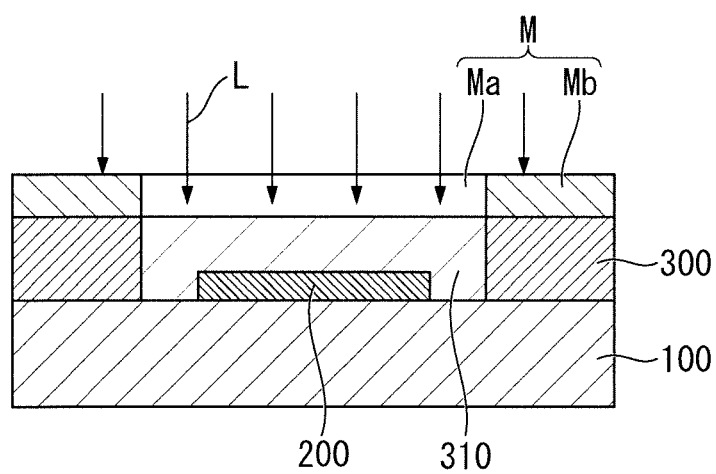
FIG. 1B is a process view showing the method of manufacturing a laminate according to the first embodiment.
Figure 1C:
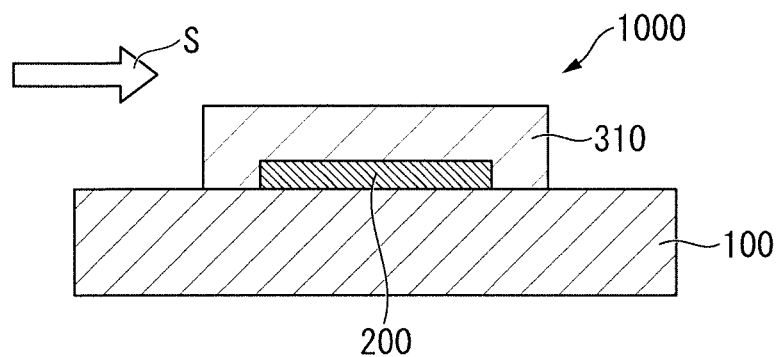
FIG. 1C is a process view showing the method of manufacturing a laminate according to the first embodiment.

FIGS. 1A to 1C are process views showing a method of manufacturing a laminate according to the present embodiment.

First, as shown in FIG. 1A, a solution in which the aforementioned curable composition is dissolved in an organic solvent (hereinafter, referred to as "a raw material solution") is applied over a conductive layer 200 formed on a substrate 100, and the solvent is removed. Thereby, a coating film 300 is formed.

Examples of the formation material of the substrate 100 may include: inorganic materials, such as glass, quartz glass, and silicon nitride; and organic materials (resin materials), such as acrylic resins, polycarbonate resins, polyester resins such as polyethylene terephthalate (PET) and polybutylene terephthalate (PBT).

As the conductive layer 200, wirings and electrodes can be exemplified. Examples of the formation material of the conductive layer 200 may include conductive polymers, metals such as Al, Ag and Au, and alloys. Generally known formation materials can be used in addition to these formation materials.

The coating film 300 is formed by applying the raw material solution and then removing the solvent. As the method of applying the raw material solution, generally known methods, such as spin coating, dip coating, spray coating, roll coating, brushing, flexographic printing, inkjet printing, and screen printing, may be exemplified.

In addition, as the solvent dissolving the curable composition, various organic solvents can be used. Examples of the organic solvent may include: alcohols, such as methanol, ethanol, 1-propanol, and 2-propanol (isopropyl alcohol (IPA)); ethers, such as propylene glycol monomethyl ether acetate (PGMEA); aromatic hydrocarbons, such as toluene and xylene; nitriles such as acetonitrile; esters such as acetic acid ester; ketones, such as acetone, methyl ethyl ketone, methyl isobutyl ketone, and cyclohexanone. These organic solvents may be used alone or in a mixture of two or more.

In order to remove a solvent from the applied raw material solution, a method of volatilizing the solvent using generally known operations such as heating, air blow and depressurization can be used. These operations may be used in a combination of two or more. In addition, the film obtained by removing a solvent from the raw material solution is prebaked. Thereby, the non-patterned coating film 300 is formed. The prebaking is performed, for example, by heating the film obtained by removing a solvent from the raw material solution at 105° C. for 5 minutes.

Next, as shown in FIG. 1B, the coating film 300 is irradiated with ultraviolet L (light) through a mask M provided with an opening Ma in a region overlapping the conductive layer 200 in a plan view and having a light shielding portion Mb around the opening Ma, so as to allow the coating film 300 to be exposed to light. The ultraviolet L is light having an absorption wavelength of the photocationic polymerization initiator included in the curable composition. For example, in the mask exposure of the present embodiment, ultraviolet of i-line ray (365 nm) is irradiated at an irradiation intensity of 500 mJ/cm$^2$. Accordingly, a photocationic polymerization reaction proceeds in the coating film 300, and the latent image of an insulator layer 310 is formed on the coating film 300.

Here, in order to accelerate a curing reaction by photocationic polymerization, a heat treatment may be performed in a temperature range of 100° C. to 120° C. for 10 minutes. This heat treatment may be performed simultaneously with the irradiation of ultraviolet L and may also be performed after the irradiation of ultraviolet L.

Next, as shown in FIG. 1C, the coating film 300 subjected to mask exposure as shown in FIG. 1B is developed using an alkaline solution as a developer S. As the developer S, for example, 2.38 mass % of an aqueous TMAH solution can be used, and the developing time, for example, may be set to 1 minute.

The solubility of the exposed region (insulator layer 310) of the coating film 300 in the developer S relatively decreases compared to that of the non-exposed region in the coating film 300, because photocationic polymerization proceeds and the molecular weight increases. Therefore, the non-exposed region of the coating film 300 is dissolved and developed by the developer S, and thereby it is possible to form a laminate 1000 having the insulator layer 310 covering the conductive layer 200.

Prior to applying a raw material solution shown in FIG. 1A, a surface treatment may be applied on at least a region in which the insulator layer 310 will be formed by using a silane coupling agent (first silane coupling agent) having a cyclic ether group. A specific example of such a silane coupling agent includes 3-glycidoxypropyl triethoxysilane (KBM-403, manufactured by Shin-Etsu Silicone Co., Ltd.). When such a silane coupling agent is applied in advance and a surface treatment is performed, the cyclic ether group included in the silane coupling agent reacts and bonds to an organic compound included in the curable composition during a photocationic polymerization reaction. Therefore, an adhesion power between the insulator layer 310 to be formed and the substrate 100 and an adhesion power between the insulator layer 310 to be formed and the conductive layer 200 are enhanced, and it is possible to suppress damage to the laminate 1000.

The method of manufacturing a laminate as described above uses a curable composition that is developable by an alkaline solution and is capable of forming an insulator layer. Therefore, it is possible to provide a manufacturing process in which a manufacturing load is reduced.

The laminate as described above uses a curable composition that is developable by an alkaline solution and is capable of forming an insulator layer. Therefore, even when a resin substrate is used, it is possible to preventing the substrate from being dissolved or swelled.

As the laminate 1000 having a laminated structure manufactured in this way, a wiring board, a condenser, and the like, each having a multi-layer interconnect structure, are exemplified.

Second Embodiment (Manufacturing Method of Transistor, Transistor)

Next, a method of manufacturing a transistor according to a second embodiment of the present invention and a transistor will be described with reference to FIGS. 2 to 4B.

Figure 2:
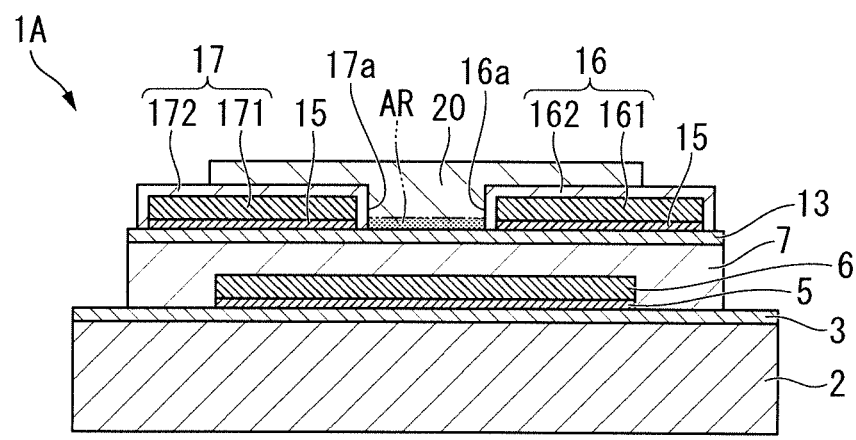
FIG. 2 is a schematic cross-sectional view showing a transistor of a second embodiment.

FIG. 2 is a schematic cross-sectional view showing a transistor manufactured by the method of manufacturing a transistor according to the present embodiment, and a transistor according to the present embodiment. A transistor 1A is a so-called bottom-contact type transistor. In the following description, there will be described an organic transistor using an organic semiconductor as the formation material of a semiconductor layer, but the present invention is also applicable to an inorganic transistor using an inorganic semiconductor as the formation material of a semiconductor layer.

The transistor 1A includes a substrate 2, base films 3 and 13, electroless plating catalysts 5 and 15, a gate electrode 6, an insulator layer 7, a source electrode 16, a drain electrode 17, and an organic semiconductor layer (semiconductor layer) 20. In the transistor 1A, the layer of a combination of the insulator layer 7 and the base film 13 refers to "a layer containing an insulator layer".

As the substrate 2, any of a substrate having optical transparency and a substrate not having optical transparency can be used. For example, the substrate 2 can be made of any one of: inorganic materials such as glass, quartz glass, and silicon nitride; and organic polymers (resins), such as acrylic resins, polycarbonate resins, and polyester resins (for example, polyethylene terephthalate (PET), polybutylene terephthalate (PBT), and the like).

The formation material of these substrates 2 does not form a metallic bond together with a metal-made plating film formed as a result of electroless plating. For this reason, in the present embodiment, the formation material of these substrates 2 is treated as a poor plating material on which a plating film is not easily formed directly, and the formed plating film is easily stripped. Due to the similar reason, if the plating film is made of an easily-strippable material, for example, a composite material of the above-mentioned material and the like can also be similarly used as the formation material of the substrate 2.

The base film 3 is a gate base film in the present invention. The base film 3 is formed over the entire surface of the main side of the substrate 2, and part of the surface of the base film 3 is selectively provided with a catalyst (electroless plating catalyst) 5. The catalyst 5 is a catalyst for reducing metal ions contained in a plating solution for electroless plating. As the catalyst, silver, metal palladium, and the like are exemplified. In the present embodiment, metal palladium is used.

The base film 3 is a film capable of capturing a metal that is the above-mentioned catalyst 5, and a silane coupling agent (second silane coupling agent) having a group capable of capturing the metal is used as the formation material of the base film 3. The base film 3 is formed by applying a liquid product containing such a silane coupling agent onto the main side of the substrate 2.

The "silane coupling agent", which is the formational material of the base film 3, is a compound in which a group capable of capturing the metal (catalyst 5) and a group capable of being bonded to the substrate 2 are bonded to a silicon atom.

Here, the "group capable of capturing the metal" refers to a group that can capture the metal (catalyst 5) or ions of this metal, for example, by an ion bond or a coordinate bond. As this group, a group having a nitrogen atom or a sulfur atom is exemplified. Examples of the group having a nitrogen atom or a sulfur atom may include an amino group, a urea group, a thiol group (or a mercapto group), a thiocarbonyl group, a thiourea group, and a group obtained by removing one or more hydrogen atoms bonded to a heterocyclic compound containing a nitrogen atom or a sulfur atom. Examples of the "heterocyclic compound containing a nitrogen atom or a sulfur atom" include: monocyclic aromatic heterocyclic compounds, such as pyrrole, imidazole, pyridine, pyrimidine, and thiophene; polycyclic aromatic heterocyclic compounds, such as indole and benzothiophene; and non-aromatic heterocyclic compounds in which two or more carbon atoms in an aromatic ring of each of these aromatic compounds are hydrogenated.

As the "group capable of being bonded to the substrate 2", a hydroxyl group and an alkoxy group of 1 to 6 carbon atoms are exemplified.

Specific examples of the compound that can be used as the formation material of the base film 3 may include N-cyclohexyl-aminopropyltrimethoxysilane, bis(3-(trimethoxysilyl)propyl)ethylenediamine, 1-(3-(trimethoxysilylpropyl))urea, bis(3-trimethoxysilylpropyl))urea, 2,2-dimethoxy-1,6-diaza-2-silacyclooctane, N-(3-(trimethoxysilyl propyl))-4,5-dihydroimidazole, bis(3-(trimethoxysilyl)propyl)thiourea, 3-trimethoxysilylpropanethiol, and polyethyleneimine modified with a trimethoxysilylpropyl group.

Among these, as the silane coupling agent, a silane coupling agent having an amino group as the "group capable of capturing metal" is preferable, and a silane coupling agent, which is a primary amine or a secondary amine ("group capable of capturing metal" is a group represented by —NH$_2$ or —NH—), is more preferable. In the following description, as the base film 3, a base film formed by using a silane coupling agent as a primary amine will be described.

The gate electrode 6 is a metal electrode formed on the surface of the catalyst 5, and, as described later, is formed of a metal deposited on the surface of the catalyst 5 by electroless plating. As the material of the gate electrode 6, nickel phosphorus (NiP) or copper (Cu) is exemplified.

The insulator layer 7 electrically insulates the gate electrode 6 having insulating properties from the source electrode 16 and the drain electrode 17. In the insulator layer 7 of the present embodiment, the above-mentioned curable composition in the first embodiment is used as a formation material.

The base film 13 is formed on the entire upper surface of the insulator layer 7. The base film 13 is a source base film and is a drain base film in the present invention, and the source base film and the drain base film are formed as a continuous film. The base film 13 is formed over the entire surface of the main side of the substrate 2, and part of the surface of the base film 13 is selectively provided with a catalyst (catalyst for electroless catalyst) 15. The formation material of the catalyst 15 may be the same as that of the above-mentioned catalyst 5.

The formation material of the base film 13 is the same as that of the above-mentioned base film 3, but the formation materials of the base film 3 and the base film 13 may be different from each other. In the following description, a case where the base film 13 is formed by using a silane coupling agent as a primary amine which is the same as that used for the base film 3 will be described.

In the drawing, it is shown that the base film 13 is formed on the entire upper surface of the insulator layer 7, but the base film 13 may be selectively formed on only a location where the catalyst 15 is provided. In this case, a silane coupling agent, which is a formation material of the base film 13, is selectively applied to the upper surface of the insulator layer 7 using a generally known method, and thereby it is possible to selectively form the base film 13. Further, in the upper surface of the insulator layer 7, first, the silane coupling agent may be applied to a region larger than the region forming the base film 13, and then a film formed at a portion protruding from the region forming the base film 13 may be irradiated with ultraviolet to thereby decompose and remove the silane coupling agent to selectively form the base film 13.

The source electrode 16 and the drain electrode 17 are metal electrodes formed on the surface of the catalyst 15. The source electrode 16 has a first electrode 161 and a second electrode 162 covering the surface of the first electrode 161. Similarly, the drain electrode 17 has a third electrode 171 and a fourth electrode 172 covering the surface of the third electrode 171.

The first electrode 161 and the third electrode 171, similarly to the above-mentioned gate electrode 6, are formed by electroless plating. As the material of each of the first electrode 161 and the third electrode 171, nickel phosphorus (NiP) or copper (Cu) is exemplified. In the present embodiment, it is described that nickel phosphorus (work function: 5.5 eV) is used as the formation material of each of the first electrode 161 and the third electrode 171. Here, the first electrode 161 and the third electrode 171 may each be formed using a different material.

The second electrode 162 and the fourth electrode 172 are metal plating layers, each being formed over the entire surface of each of the first electrode 161 and the third electrode 171, the surface not being in contact with the catalyst 15. That is, the second electrode 162 is provided to cover a lateral side 16a in the source electrode 16. The fourth electrode 172 is provided to cover a lateral side 17a in the drain electrode 17. The lateral sides 16a and 17a (opposing surfaces) face each other.

As the formation material of each of the second electrode 162 and the fourth electrode 172, a metal material having a work function in which electron transfer (or hole transfer) is easy in relation to the HOMO/LUMO level of the formation material of a semiconductor layer 20 to be described later is used. In the present embodiment, it is described that gold (work function: 5.4 eV) is used as the formation material of each of the second electrode 162 and the fourth electrode 172. Here, the second electrode 162 and the fourth electrode 172 may each be formed using a different material.

The semiconductor layer 20 is provided on the surface of the base film 13 between the source electrode 16 and the drain electrode 17, and is formed in contact with the source electrode 16 and the drain electrode 17. Specifically, the semiconductor layer 20 is provided in contact with the lateral side 16a of the source electrode 16 and the lateral side 17a of the drain electrode 17, and is in contact with the second electrode 162 and the fourth electrode 172.

As the formation material of the semiconductor layer 20, generally known organic semiconductor materials can be used. Examples of the semiconductor materials may include: p-type semiconductors, such as copper phthalocyanine (CuPc), pentacene, rubrene, tetracene, and P3HT (poly (3-hexylthiophene-2,5-diyl)); and n-type semiconductors, such as fullerenes such as $C_{60}$ and perylene derivatives such as PTCDI-C8H (N,N'-dioctyl-3,4,9,10-perylene tetracarboxylic diimide). Among these, soluble pentacene such as TIPS pentacene (6,13-bis(triisopropylsilylethynyl) pentacene) or an organic semiconductor polymer such as P3HT is soluble in an organic solvent such as toluene and can be used in forming the semiconductor layer 20 by a wet process, which is preferable. In the present embodiment, it will be described that TIPS pentacene (HOMO level: 5.2 eV), which is a p-type semiconductor, is used as the formation material of the semiconductor layer 20.

Further, the formation material of the semiconductor layer 20 is not limited to organic semiconductor materials, and generally known inorganic semiconductor materials can also be used as the formation material of the semiconductor layer 20.

In this transistor 1A, the gate electrode 6, the source electrode 16, and the drain electrode 17, which are formed by electroless plating, are formed on the base films 3 and 13 (gate base film, source base film, and drain base film), which are formed by using a silane coupling agent as a formation material. For example, when these electrodes are formed in the region having an uneven shape, an uneven shape is imparted to each of these electrodes in response to unevenness of a base. In this case, the distance between the electrodes laminated through an insulator layer is not constant, and there is a possibility that the insulation is damaged and leak current is generated at the position where the distance between the gate electrode and the source electrode or the distance between the gate electrode and the drain electrode becomes closer to each other. Further, if the base has an uneven shape, there is a possibility that an uneven shape is imparted even to the channel region (represented by AR in FIG. 2) of the semiconductor layer overlapping the gate electrode in a plan view, and the migration distance of a carrier in the channel region becomes longer, thereby deteriorating the performance of the transistor 1A.

However, in the transistor 1A of the present embodiment, since the base films 3 and 13 are formed by using a silane coupling agent as a formation material and a base film containing a filler component capable of roughening the surface of the substrate is not used, these base films become smooth films. Therefore, uneven shapes are not formed by forming the base films 3 and 13, and the problems caused by the uneven shapes do not occur, and therefore the transistor 1A becomes a high-performance transistor.

Hereinafter, the method of manufacturing the above-mentioned transistor 1A will be described with reference to FIGS. 3A to 3Q.

Figure 3A:
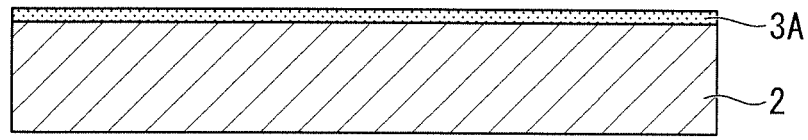
FIG. 3A is a process view showing a manufacturing method of the second embodiment.

First, as shown in FIG. 3A, a liquid product, which is obtained, if necessary, by diluting the above-mentioned silane coupling agent with an organic solvent, is applied onto the surface of a substrate 2 to form a coating film 3A. As the method of applying the liquid product, generally known methods, such as spin coating, dip coating, spray coating, roll coating, brushing, flexographic printing, and screen printing, may be exemplified.

Here, it will be described that 3-aminopropyltriethoxysilane, which is a primary amine, is used as the silane coupling agent.

As the organic solvent, various organic solvents can be used as long as the solvents are capable of dissolving the silane coupling agent. Among these organic solvents, a polar solvent can be preferably used. Examples of the solvent that can be used may include: alcohols, such as methanol, ethanol, 1-propanol, and 2-propanol (isopropyl alcohol (IPA)); ethers, such as propylene glycol monomethyl ether acetate (PGMEA); aromatic hydrocarbons, such as toluene; nitriles such as acetonitrile; esters such as acetic acid ester; and ketones, such as acetone, methyl ethyl ketone, and methyl isobutyl ketone.

Figure 3B:
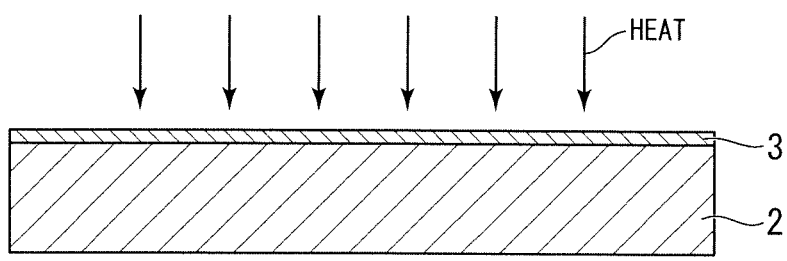
FIG. 3B is a process view showing the manufacturing method of the second embodiment.

Next, as shown in FIG. 3B, the organic solvent is volatilized and removed by a heat treatment to form a base film 3. The base film 3 formed in this manner is a silane coupling agent layer having an extremely thin film thickness, and therefore becomes a transparent film in which light scattering does not easily occur. Therefore, for example, if the transistor manufactured by the method of the present embodiment is provided on a substrate having optical transparency, it is possible to maintain the optical transparency as a combination of the substrate 2 and the base film 3 even when the base film 3 is formed on the entire surface of the substrate 2, and it is possible to easily form the film.

Figure 3C:
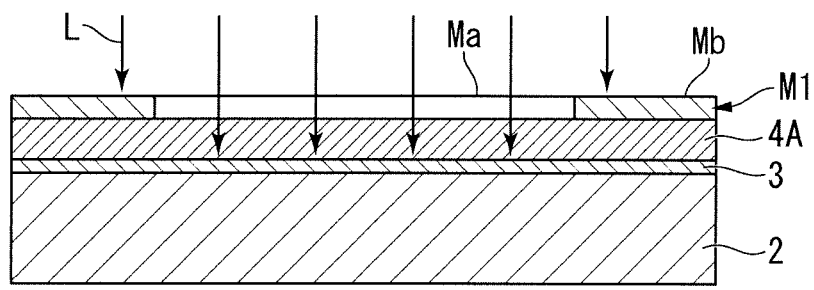
FIG. 3C is a process view showing the manufacturing method of the second embodiment.

Next, as shown in FIG. 3C, a resist material is applied onto the base film 3, and is then prebaked to thereby form a resist layer 4A that is not patterned. Here, as the resist material, a positive photoresist is used.

Thereafter, the resist layer 4A is irradiated with ultraviolet L through a mask M1 including an opening Ma provided at the position corresponding to the region forming a metal electrode and including a light shielding portion Mb provided in the region not forming the metal electrode, so as to expose the resist layer 4A to light.

Figure 3D:
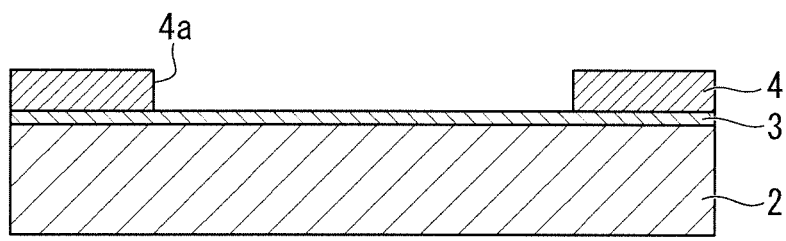
FIG. 3D is a process view showing the manufacturing method of the second embodiment.

Next, as shown in FIG. 3D, the resist layer irradiated with ultraviolet is developed by a developer that dissolves the resist layer to thereby form a resist layer 4 provided with an opening 4a.

Figure 3E:
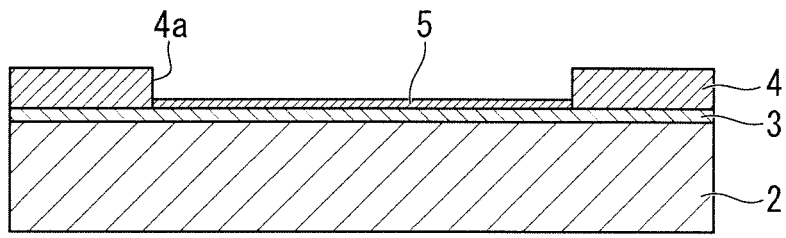
FIG. 3E is a process view showing the manufacturing method of the second embodiment.

Next, as shown in FIG. 3E, a catalyst 5 used in electroless plating is captured on the surface of the base film 3 exposed through the opening 4a formed in the resist layer 4. Specifically, a metal, which is the catalyst 5, is captured on the base film 3 by contacting a colloidal solution of a divalent palladium salt.

A general electroless plating process of a resin proceeds in the order of washing, etching, catalyst imparting, and then electroless plating. Here, the "catalyst imparting" is a process of attaching a metal such as palladium (Pd), serving as an electroless plating reaction initiator (catalyst), to the surface of the region for carrying out plating. Generally, the "catalyst imparting" includes a process of bringing a colloidal solution of a divalent palladium salt and a divalent tin (Sn) salt into contact with a substrate to be attached by palladium and then immersing the substrate coated with the colloidal solution into an acid or alkali solution, called an accelerator. Thereby, the divalent palladium is reduced to zero-valent palladium, and the catalyst is activated.

In contrast, as described in the present embodiment, it was confirmed by the inventors that, if the silane coupling agent, which is a formation material of a base film, is a primary amine or a secondary amine, the reduction treatment using the above-mentioned accelerator is not required (which will be described later). Therefore, when a primary amine or a secondary amine is used as the silane coupling agent, the operation of electroless plating is simplified.

In the present embodiment, since 3-aminopropyltriethoxysilane, which is a primary amine, is used as the formation material of the base film 3, a reduction treatment is not required, and the operation is simplified.

On the other hand, when the silane coupling agent is a tertiary amine or a silicon compound having another "group capable of capturing a metal", a colloidal solution of a divalent palladium salt is applied, and then a normal treatment (activating process) using the above-mentioned accelerator is performed. Thereby, it is possible to capture a catalyst 5 for electroless plating on the base film 3.

Figure 3F:
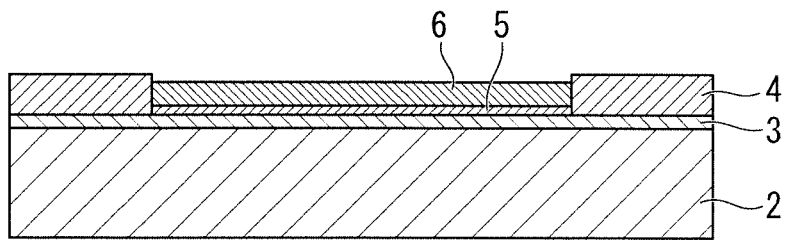
FIG. 3F is a process view showing the manufacturing method of the second embodiment.

Next, as shown in FIG. 3F, an electroless plating solution is brought into contact with the catalyst 5. Thereby, metal ions dissolved in the electroless plating solution is reduced and deposited on the surface of the catalyst 5, and a gate electrode 6 containing nickel phosphorus as a formation material is selectively formed in the opening 4a. When the silane coupling agent is a primary amine or a secondary amine, the catalyst 5 is immersed in the electroless plating solution without performing the activation using the accelerator, and thereby the surface of the catalyst 5 is plated. Therefore, it can be indirectly confirmed that metal palladium is captured on the surface of the base film 3.

Figure 3G:
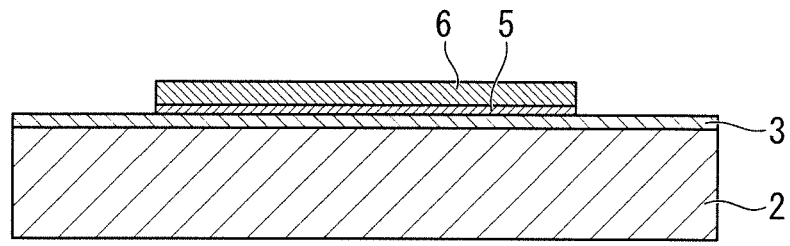
FIG. 3G is a process view showing the manufacturing method of the second embodiment.

Next, as shown in FIG. 3G, the entire surface of the remaining resist layer is exposed to ultraviolet, and then the resist layer is removed by a generally known developer. In this way, the gate electrode 6 is formed.

Figure 3H:
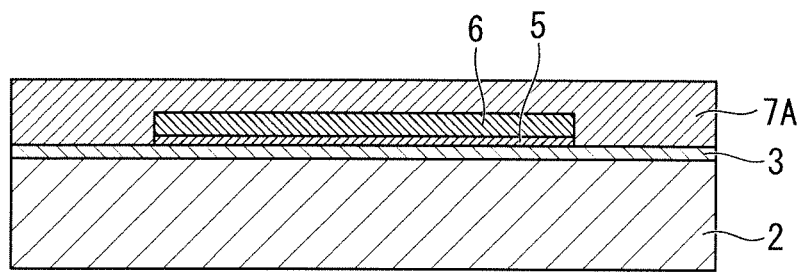
FIG. 3H is a process view showing the manufacturing method of the second embodiment.

Next, as shown in FIG. 3H, a solution (raw material solution), in which the curable composition of the first embodiment is dissolved in an organic solvent, is applied to the surface of the base film 3 to cover the gate electrode 6. As the application method, the above-mentioned method can be used.

As the organic solvent, a material which is the same as that described in the first embodiment can be used.

Further, in the raw material solution, when concentration and the kind of an organic solvent are changed, the viscosity of the entire raw material solution can be adjusted, and the thickness of the coating film 7A of the raw material solution can be controlled.

In the process shown in FIG. 3H, in order to control the leak between the gate electrode 6 and the source electrode to be formed above and the leak between the gate electrode 6 and the drain electrode to be formed above, the photoresist is thickly applied such that the thickness of the coating film 7A is about several hundreds of nanometers. Here, the thickness of the coating film 7A is not limited thereto.

Figure 3I:
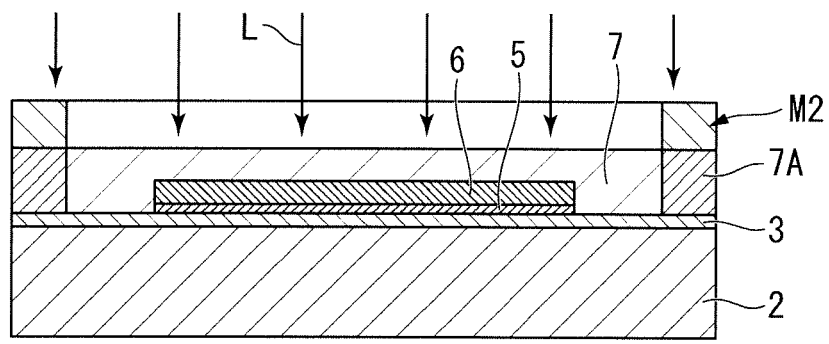
FIG. 3I is a process view showing the manufacturing method of the second embodiment.

Next, as shown in FIG. 3I, the coating film 7A is irradiated with ultraviolet L through a mask M2 provided with an opening corresponding to the region forming an insulator layer 7 to cure the curable composition, thereby forming the insulator layer 7. In this case, in order to accelerate the curing reaction of the curable composition, a heat treatment can be performed simultaneously with the ultraviolet irradiation or after the ultraviolet irradiation.

Figure 3J:
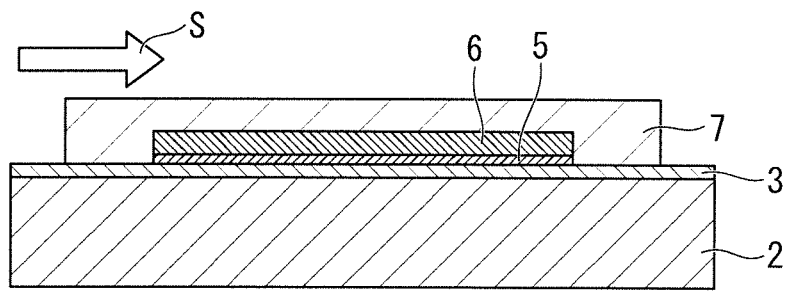
FIG. 3J is a process view showing the manufacturing method of the second embodiment.

Next, as shown in FIG. 3J, the coating film 7A is developed by an alkaline solution (developer S) that dissolves the coating film 7A to thereby remove the uncured coating film and form an insulator layer 7 that is patterned.

Here, in order to improve the adhesiveness between the insulator layer 7 and the gate electrode 6, the silane coupling agent may be applied to cover the surface including the gate electrode 6 before the application of the raw material solution.

Figure 3K:
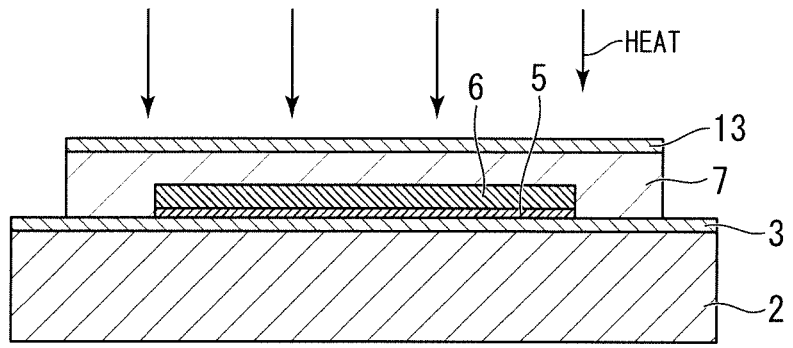
FIG. 3K is a process view showing the manufacturing method of the second embodiment.

Next, as shown in FIG. 3K, a liquid product, which is obtained, if necessary, by diluting the above-mentioned silane coupling agent with an organic solvent, is applied onto the entire upper surface of the insulator layer 7, and then a heat treatment is performed to volatilize and remove the organic solvent, so as to form a base film 13. The silane coupling agent and the organic solvent may be the same as those used in the formation of the base film 3 described above.

Figure 3L:
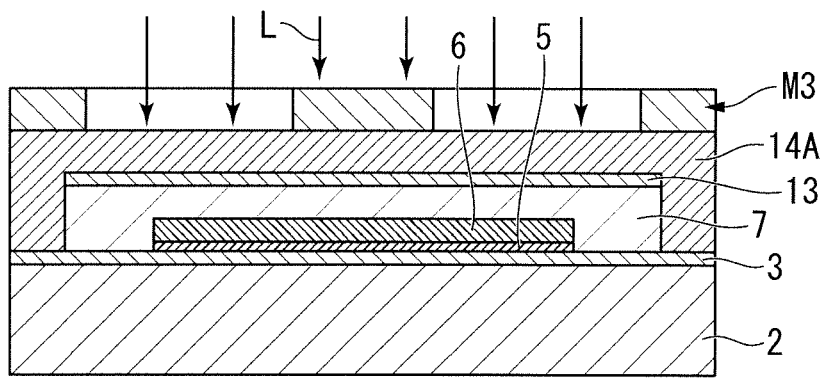
FIG. 3L is a process view showing the manufacturing method of the second embodiment.

Next, as shown in FIG. 3L, a resist material is applied over the insulator layer 7 and the base film 13 and is then prebaked. Thereby, a resist layer 14A that is not patterned is formed. Here, as the resist material, a positive photoresist is used.

Thereafter, the resist layer 14A is irradiated with ultraviolet L through a mask M3 provided with an opening corresponding to the region forming a source electrode and a drain electrode, so as to expose the resist layer 14A to light.

Figure 3M:
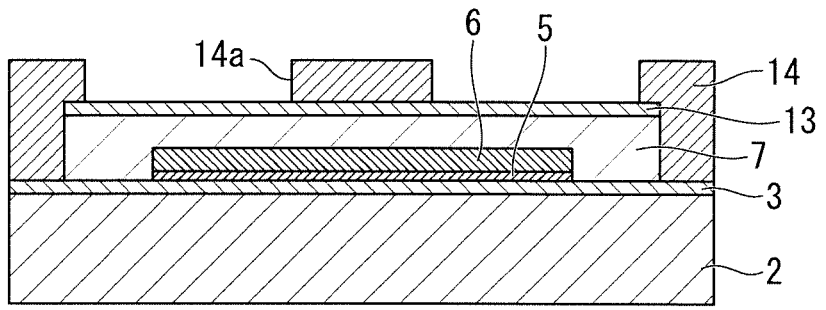
FIG. 3M is a process view showing the manufacturing method of the second embodiment.

Next, as shown in FIG. 3M, the resist layer irradiated with ultraviolet is developed by a developer that dissolves the resist layer to thereby form a resist layer 14 provided with an opening 14a.

Figure 3N:
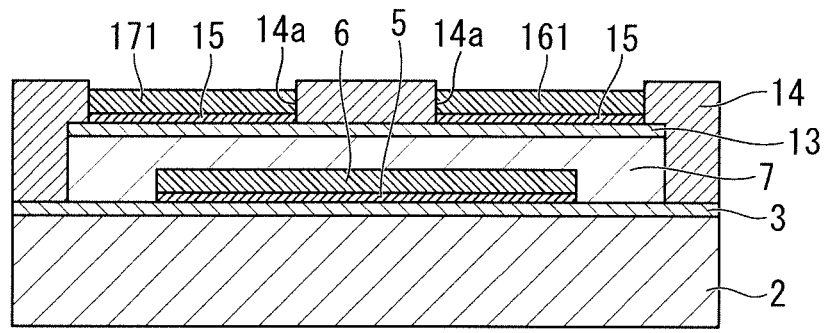
FIG. 3N is a process view showing the manufacturing method of the second embodiment.

Next, as shown in FIG. 3N, a colloidal solution of a divalent palladium salt is made to come into contact with the base film 13 exposed through the opening 14a. Thereby, the catalyst 15 used in electroless plating is captured to the surface of the base film 13. Thereafter, an electroless plating solution is made to come into contact with the catalyst 15. Thereby, metal ions dissolved in the electroless plating solution are reduced and deposited on the surface of the catalyst 15, and a first electrode 161 and a third electrode 171 made of nickel phosphorus are selectively formed in the opening 14a.

Figure 3O:
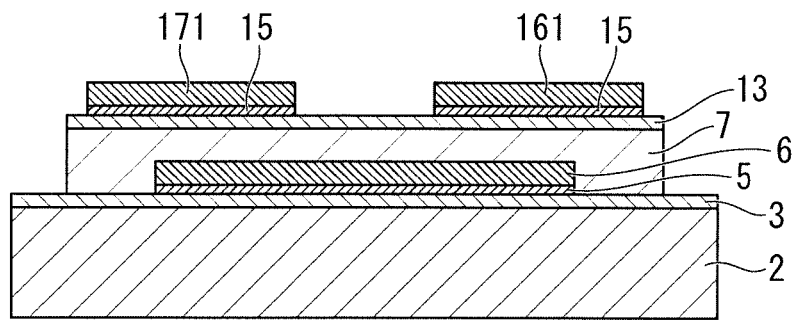
FIG. 3O is a process view showing the manufacturing method of the second embodiment.

Next, as shown in FIG. 3O, the entire surface of the remaining resist layer is exposed to ultraviolet, and then the resist layer is removed by a generally known developer. In this way, the first electrode 161 and the third electrode 171 are formed.

Figure 3P:
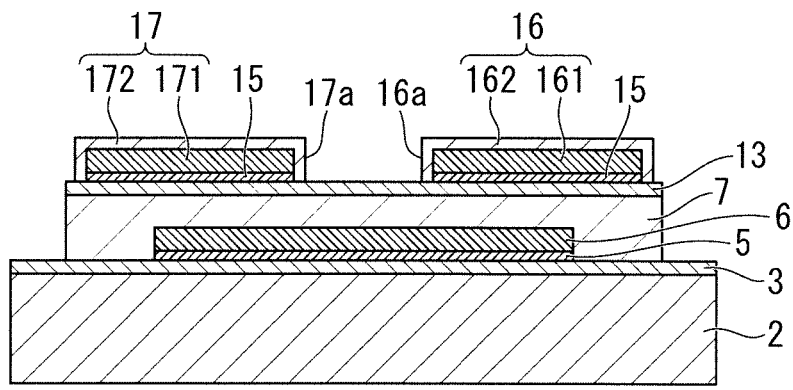
FIG. 3P is a process view showing the manufacturing method of the second embodiment.

Next, as shown in FIG. 3P, the entire body is immersed into a gold plating bath for substitution to allow the surface of the first electrode 161 and the third electrode 171 to be substituted and deposited with gold, and is further immersed into a gold plating bath for reduction to thereby form a second electrode 162 and a fourth electrode 172, which are plated with gold, on the surface of the first electrode 161 and the third electrode 171. In this way, a source electrode 16 and a drain electrode 17 are formed.

Figure 3Q:
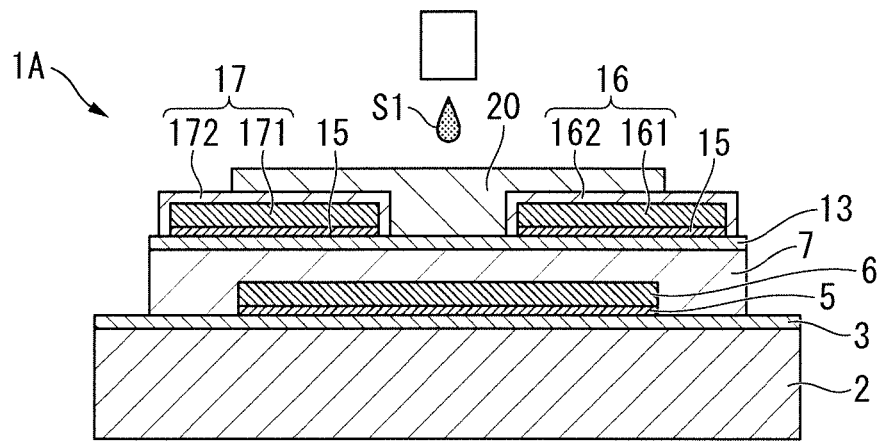
FIG. 3Q is a process view showing the manufacturing method of the second embodiment.

Next, as shown in FIG. 3Q, a solution S1, in which an organic semiconductor material soluble in an organic solvent, such as TIPS pentacene, is dissolved in the organic solvent, is applied between the source electrode 16 and the drain electrode 17, and is dried to thereby form a semiconductor layer 20. Here, the semiconductor layer 20 is formed by a wet method, but can also be formed by a sublimation method, a transfer method, or the like.

In this way, it is possible to manufacture the transistor 1A.

Prior to applying a raw material solution shown in FIG. 3H, a surface treatment may be applied on at least a region in which the insulator layer 7 will be formed by using a silane coupling agent having a cyclic ether group.

A specific example of such a silane coupling agent includes 3-glycidoxypropyl triethoxysilane (KBM-403, manufactured by Shin-Etsu Silicone Co., Ltd.). When such a silane coupling agent is applied in advance and a surface treatment is performed, the cyclic ether group included in the silane coupling agent reacts and bonds to an organic compound included in the curable composition during a photocationic polymerization reaction. Therefore, an adhesion power between the insulator layer 7 to be formed and the substrate 2 (base film 3) and an adhesion power between the insulator layer 7 to be formed and the gate electrode 6 are enhanced, and it is possible to suppress damage to the transistor 1A.

In the method of manufacturing a transistor of the configuration as described above, a curable composition that is developable by an alkaline solution and is capable of forming an insulator layer is used. Therefore, it is possible to provide a manufacturing process in which a manufacturing load is reduced.

In the transistor as described above, the insulator layer 7 is formed by using a curable composition that is developable by an alkaline solution. Therefore, even when a resin substrate is used, it is possible to prevent the substrate from being dissolved or swelled by a developer, and it is possible to form a transistor with reduced degradation during manufacturing.

Further, since the base films 3 and 13 are formed by using a silane coupling agent as a formation material and are smooth films, problems caused by the uneven shapes of the base films do not occur, and a high-performance transistor can be obtained.

Further, since the resist layer 14 is previously removed before the formation of the second electrode 162 and the fourth electrode 172, the second electrode 162 and the fourth electrode 172 can be surely formed even on the lateral side 16a of the source electrode 16 and the lateral side 17a of the drain electrode 17. Therefore, in the manufactured transistor 1A, electric current easily flows between the semiconductor layer 20 and the source electrode 16 (or between the semiconductor layer 20 and the drain electrode 17) at the time of driving, and the transistor 1A can be well driven.

Further, the first electrode 161 is covered with the second electrode 162, and the third electrode 171 is covered with the fourth electrode 172. Thereby, the temporal corrosion of the first electrode 161 and the third electrode 171 is suppressed, and there is also an advantage in that the performance of the transistor can be stably maintained.

Figure 4A:
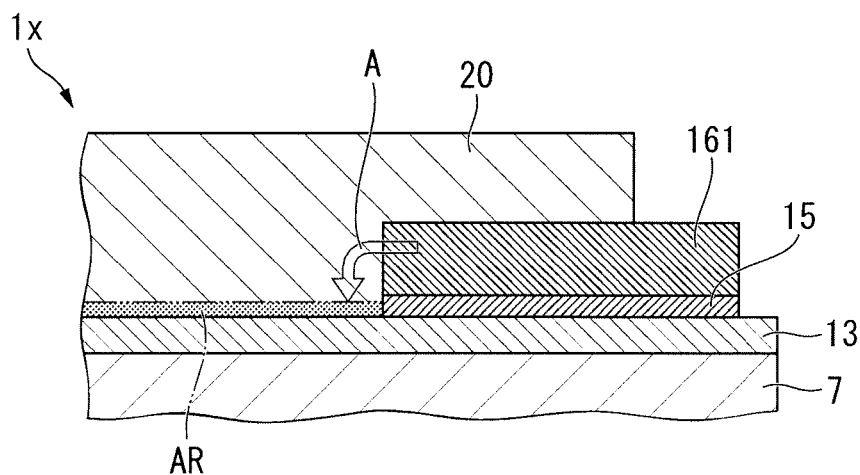
FIG. 4A is a view showing a drive status of the transistor of the second embodiment.
Figure 4B:
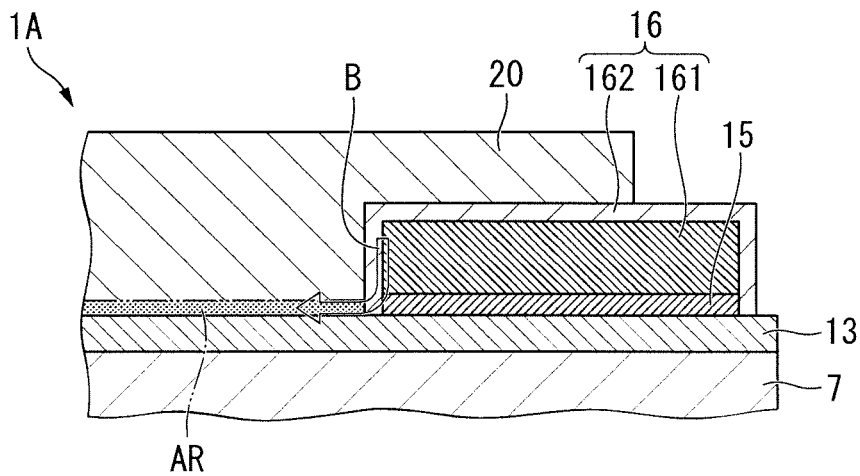
FIG. 4B is a view showing a drive status of the transistor of the second embodiment.

FIGS. 4A and 4B are schematic views showing the drive status of a transistor. FIG. 4A is a view showing a transistor 1x which has the same configuration as the transistor 1A except that the transistor 1x does not have the second electrode. FIG. 4B is a view showing the transistor 1A manufactured by the method of the present embodiment.

Here, in the present embodiment, the phrase "energy level of molecular orbital used in electron transfer in the formation material of an organic semiconductor layer" refers to the energy level of HOMO in the case where the organic semiconductor layer is made of a p-type semiconductor, and refers to the energy level of LUMO in the case where the organic semiconductor layer is made of an n-type semiconductor.

First, as in the transistor 1x shown in FIG. 4A, when the transistor 1x has a configuration which does not include the second electrode, since the gap (energy level difference) between the energy level of HOMO of the semiconductor layer 20 and the work function of the first electrode 161 becomes large, Schottky barrier occurs, and electric current hardly flows. Therefore, for example, as shown by an arrow A in FIG. 4A, it is easy to form the flow of electric current through the highly-resistant semiconductor layer 20, and it is difficult to secure a good conduction.

In contrast, as shown in FIG. 4B, in the transistor 1A, when a voltage is applied to the gate electrode (not shown), a channel region AR having a thickness of several nanometers (nm) is formed in the semiconductor layer 20 around the interface between the semiconductor layer 20 and the base film 13, enabling the conduction between the source electrode 16 and the drain electrode (not shown). In this case, the surface of the source electrode 16 is provided with the second electrode 162, which is formed using a metal material having a work function (energy level difference with HOMO of the semiconductor layer 20 is small) at which electron transfer is easier between the second electrode 162 and the formation material of the semiconductor layer 20 compared to between the second electrode 162 and the first electrode 161, and the Shottky barrier is reduced, so that electric current easily flows into the channel region AR through the first electrode 161 and the second electrode 162. FIG. 4B shows the flow of electric current using an arrow B. Therefore, it is possible to realize a high-performance transistor 1A.

Third Embodiment

Figure 5:
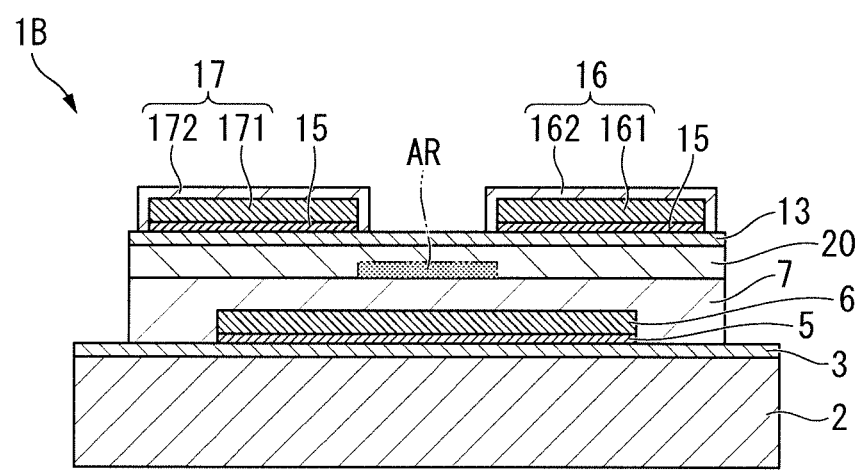
FIG. 5 is a schematic cross-sectional view of a transistor of a third embodiment.

FIG. 5 is a schematic cross-sectional view of a transistor 1B, which is manufactured by the manufacturing method of a transistor according to a third embodiment of the present invention.

The transistor 1B of the present embodiment is partially in common with the transistor 1A of the second embodiment. The difference between the transistor 1A and the transistor 1B is that the transistor of the second embodiment is a bottom contact transistor, and the transistor 1B of the present embodiment is a top contact transistor. Accordingly, in the present embodiment, the same reference numerals for the components in common with the second embodiment are used, and detailed description of the components will be omitted.

The transistor 1B includes a semiconductor layer 20 disposed on an insulator layer 7 and having a surface on which a source electrode 16 and a drain electrode 17 are formed.

That is, a semiconductor layer 20 is formed on the entire upper surface of an insulator layer 7, and a base film 13 is formed on the entire upper surface of the semiconductor layer 20. In the transistor 1B, the layer of a combination of the insulator layer 7, the semiconductor layer 20, and the base film 13 refers to a "layer containing an insulator layer".

A catalyst 15 is selectively provided on the upper surface of the base film 13, and a source electrode 16 including a first electrode 161 and a second electrode 162, and a drain electrode 17 including a third electrode 171 and a fourth electrode 172 are formed on the upper surface. In the semiconductor layer 20, the region located in the vicinity of the upper surface of the semiconductor layer and sandwiched between the source electrode 16 and the drain electrode 17 becomes a channel region AR.

Hereinafter, the method of manufacturing the above-mentioned transistor 1B will be described with reference to FIGS. 6A to 6G.

Figure 6A:
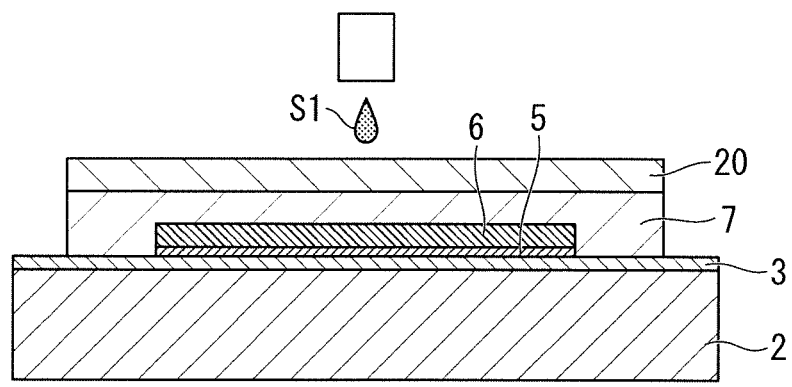
FIG. 6A is a process view showing a manufacturing method of the third embodiment.

In the manufacture of the transistor 1B, first, similarly to the second embodiment, a base film 3, a catalyst 5, a gate electrode 6, and an insulator layer 7 are laminated on the upper surface of a substrate 2. Next, as shown in FIG. 6A, a solution S1 in which an organic semiconductor soluble in an organic solvent is dissolved in the organic solvent is applied onto the insulator layer 7, and then dried to thereby form the semiconductor layer 20.

Figure 6B:
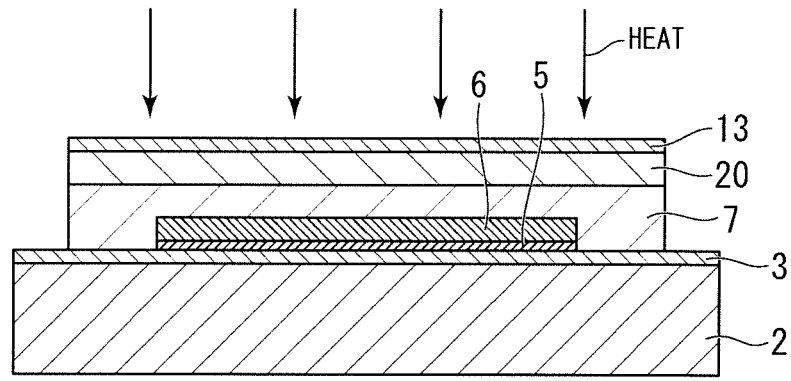
FIG. 6B is a process view showing the manufacturing method of the third embodiment.

Next, as shown in FIG. 6B, a liquid product, which is obtained, if necessary, by diluting the above-mentioned silane coupling agent with an organic solvent, is applied onto the entire upper surface of the semiconductor layer 20, and then is heat-treated to volatilize and remove the organic solvent, thereby forming a base film 13.

Figure 6C:
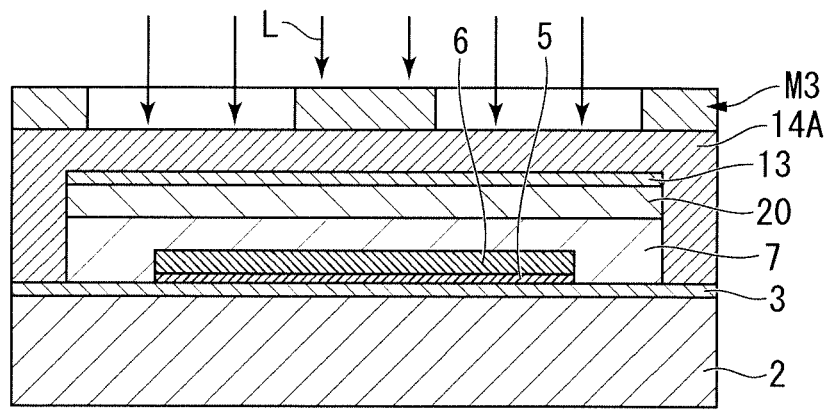
FIG. 6C is a process view showing the manufacturing method of the third embodiment.

Next, as shown in FIG. 6C, a resist material is applied over the insulator layer 7, the semiconductor layer 20, and the base film 13, and is then prebaked to thereby form a resist layer 14A that is not patterned. Thereafter, the resist layer 14A is irradiated with ultraviolet L through a mask M3 provided with an opening corresponding to the region forming a source electrode and a drain electrode, so as to expose the resist layer 14A to light.

Figure 6D:
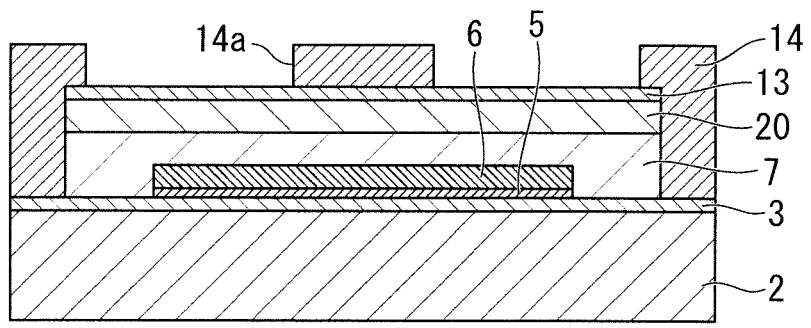
FIG. 6D is a process view showing the manufacturing method of the third embodiment.

Next, as shown in FIG. 6D, the resist layer irradiated with ultraviolet is developed by a developer dissolving the resist layer to thereby form a resist layer 14 provided with an opening 14a.

Figure 6E:
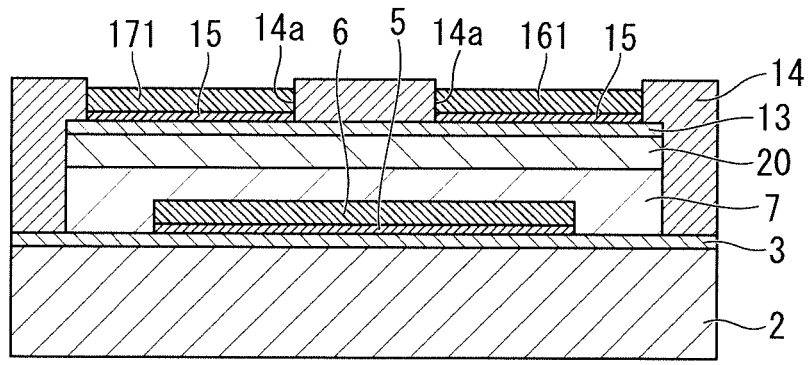
FIG. 6E is a process view showing the manufacturing method of the third embodiment.

Next, as shown in FIG. 6E, a colloidal solution of a divalent palladium salt is made to come into contact with the base film 13 exposed through the opening 14a, thereby capturing the catalyst 15 used in electroless plating to the surface of the base film 13. Thereafter, an electroless plating solution is made to come into contact with the catalyst 15. Thereby, metal ions dissolved in the electroless plating solution is reduced and deposited on the surface of the catalyst 15, and a first electrode 161 and a third electrode 171 made of nickel phosphorus are formed selectively in the opening 14a (first electroless plating).

Figure 6F:
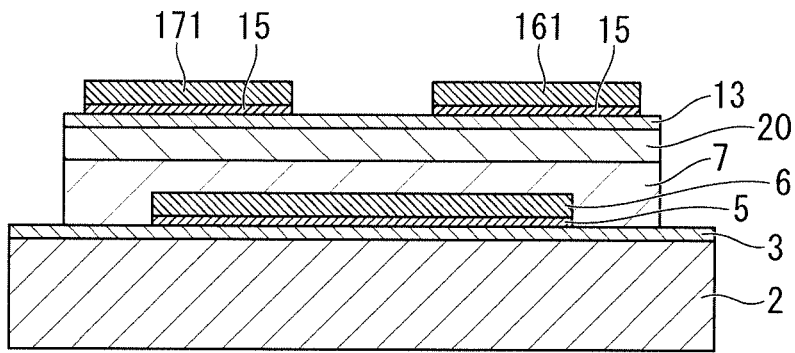
FIG. 6F is a process view showing the manufacturing method of the third embodiment.

Next, as shown in FIG. 6F, the entire surface of the remaining resist layer is exposed to ultraviolet, and then the resist layer is removed by a generally known developer. In this way, the first electrode 161 and the third electrode 171 are formed.

Figure 6G:
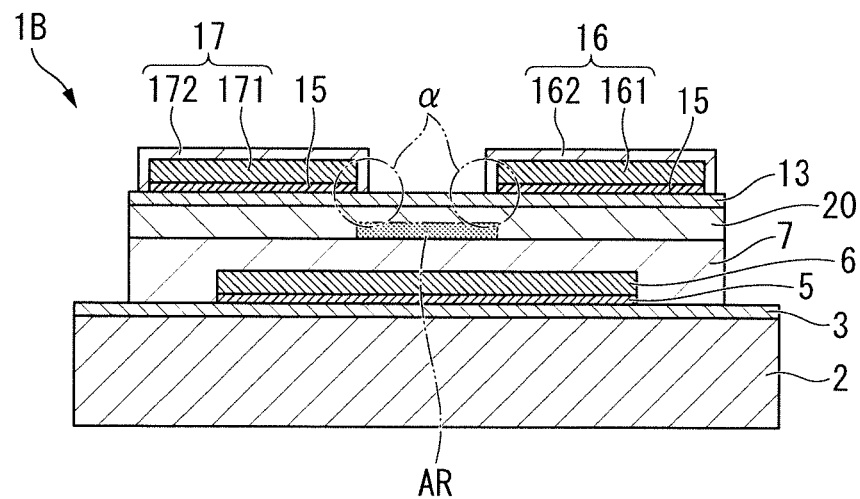
FIG. 6G is a process view showing the manufacturing method of the third embodiment.

Next, as shown in FIG. 6G, the entire body is immersed into a gold plating bath for substitution to allow the surface of the first electrode 161 and the third electrode 171 to be substituted and deposited with gold, and is further immersed into a gold plating bath for reduction to thereby form a second electrode 162 and a fourth electrode 172, which are plated with gold, on the surface of the first electrode 161 and the third electrode 171 (second electroless plating). In this way, a source electrode 16 and a drain electrode 17 are formed.

In this way, it is possible to manufacture the transistor 1B.

Also in the transistor 1B as described above, the insulator layer 7 is formed by using a curable composition that is developable by an alkaline solution. Therefore, even when a resin substrate is used, it is possible to prevent the substrate from being dissolved or swelled by a developer, and it is possible to form a transistor with reduced degradation during manufacturing.

Further, the base films 3 and 13 are formed by using a silane coupling agent as a formation material, and are smooth films. Therefore, problems caused by the uneven shapes of the base films do not occur, and it is possible to easily manufacture a high-performance transistor.

Further, in the source electrode 16 of the transistor 1B, the second electrode 162 is formed using a metal material having a work function (energy level difference with HOMO of the semiconductor layer 20 is small) at which electron transfer is easier between the formation material of the semiconductor layer 20 and the second electrode 162 compared to between the first electrode 161 and the second electrode 162. In the drain electrode 17 of the transistor 1B, the fourth electrode 172 is formed using a metal material having a work function (energy level difference with HOMO of the semiconductor layer 20 is small) at which electron transfer is easier between the formation material of the semiconductor layer 20 and the fourth electrode 172 compared to between the third electrode 171 and the fourth electrode 172. In the enclosed position shown by a reference numeral α, electric current easily flows into the channel region AR from the second electrode 162 and the fourth electrode 172, and therefore it is possible to realize a high-performance transistor 1B.

Further, since the first electrode 161 is covered with the second electrode 162 and the third electrode 171 is covered with the fourth electrode 172, the temporal corrosion of the first electrode 161 and the third electrode 171 is suppressed, and there is also an advantage in that the performance of the transistor can be stably maintained.

The transistor of the present embodiment is configured such that the semiconductor layer 20 is not in contact directly with the source electrode 16 and the drain electrode 17 but is in contact with the source electrode 16 and the drain electrode 17 through the base film 13, but the base film 13 is formed in a very thin layer having a thickness of several nanometers (nm). Therefore, the effect of the base film 13 influencing transistor characteristics is small, and electric current flows well between the semiconductor layer 20 and the source electrode 16 and between the semiconductor layer 20 and the drain electrode 17.

Heretofore, examples of embodiments of the present invention have been described with reference to the accompanying drawing, but the present invention is not limited to the examples. The shapes, combination, and the like of the components described in the above-mentioned examples are merely examples, and can be variously modified based on design requirements and the like without departing from the scope of the present invention.

For example, a substrate can be made of a non-metallic material. A plurality of plating members in each of which a base film is formed on a PET substrate (non-metallic substrate) are prepared. The plating members are conveyed, and simultaneously a transistor is manufactured using the above-mentioned manufacturing method in the conveying process. Thereby, it is possible to form a high-performance transistor on the PET substrate.

Moreover, in a roll to roll process, in which a plating member in which a base film is formed on a long PET film having flexibility, as a substrate, is rolled, the rolled plating member is conveyed while unrolling, transistors are continuously manufactured using the above-mentioned manufacturing method, and then the manufactured transistors are rolled, it is possible to form a transistor on the PET film.

Further, in the present embodiment, a base film is formed using a silane coupling agent as a formation material, a catalyst for electroless plating is captured on the base film, and then electroless plating is performed, so as to form a gate electrode, a source electrode and a drain electrode. However, these electrodes may also be formed by forming any one or two electrodes of these electrodes using the above-mentioned method and forming the remaining electrodes using another method. For example, the gate electrode may be formed using a generally known patterning method, and the source electrode and drain electrode, which are formed in the same layer, may be formed using the above-mentioned manufacturing method.

EXAMPLES

Hereinafter, the present invention will be described in more detail with reference to the following Examples, but the scope of the present invention is not limited to these Examples.

Example 1

In Example 1, a solution of the following combination was used for a raw material solution in which a curable composition is dissolved.
(Raw Material Solution 1)
(a) organic compound having a hydroxy group: 4 mass % of polyvinyl phenol (PVP) (436224, manufactured by Sigma-Aldrich Corporation)
(b) first cross-linking agent: 5 mass % of (Tris(glycidoxy-propyldimethylsiloxy)phenylsilane (SIT8715.6, manufactured by Gelest Inc.)
(c) second cross-linking agent: 1 mass % of bisphenol A epoxy monomer (RE-310s, manufactured by Nippon Kayaku Co., Ltd.)
(d) photocationic polymerization initiator: 0.5 mass % of (thiophenoxyphenyl)diphenylsulfonium hexafluorophosphate-bis(diphenylsulfonium)diphenylthioether hexafluorophosphate blend, 50% in propylene carbonate (OMPH076, manufactured by Gelest Inc.)
(e) solvent: 89.5 mass % of cyclohexanone
(Raw Material Solution 2)
Raw material solution 2 was prepared in the same manner as raw material solution 1, except that PSS-Octa[(3-glycidyloxypropyl)dimethylsiloxy]substituted (593869, manufactured by Sigma-Aldrich Corporation) was used as the first cross-linking agent (b).
(Raw Material Solution 3)
Raw material solution 3 was prepared in the same manner as raw material solution 1, except that tetraphenylol ethane glycidyl ether (412961, manufactured by Sigma-Aldrich Corporation) represented by Formula (100) below was used as the first cross-linking agent (b).

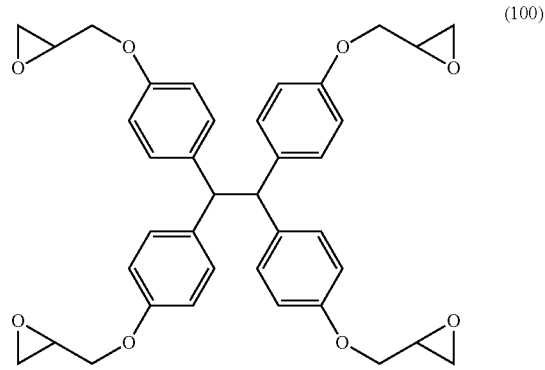 [SMILES: c1cc(C(c2ccc(OCC3CO3)cc2)C(c2ccc(OCC3CO3)cc2)c2ccc(OCC3CO3)cc2)ccc1OCC1CO1]

(Raw Material Solution 4)

Raw material solution 4 was prepared in the same manner as raw material solution 1, except that poly (2-hydroxyethyl methacrylate) (529265, manufactured by Sigma-Aldrich Corporation) was used as the organic compound (a) having a hydroxy group.

The raw material solution was applied on a PET substrate (Model number: A-4100 (no coat), manufactured by Toyobo Co., Ltd.) by spin coating (1500 rpm×30 seconds). Then, the substrate was heated at 105° C. for 5 minutes to volatilize cyclohexanone as a solvent to form a coating film of a curable composition on the PET substrate.

Next, the coating film was irradiated with i-line ray (365 nm) at an irradiation intensity of 500 mJ/cm$^2$ through a photomask having a pattern of L/S=30 μm/30 m and was further heated (post-baked) at 105° C. for 10 minutes. Then, the substrate was immersed into 2.38 mass % of an aqueous TMAH solution for 1 minute to be developed.

Figure 7:
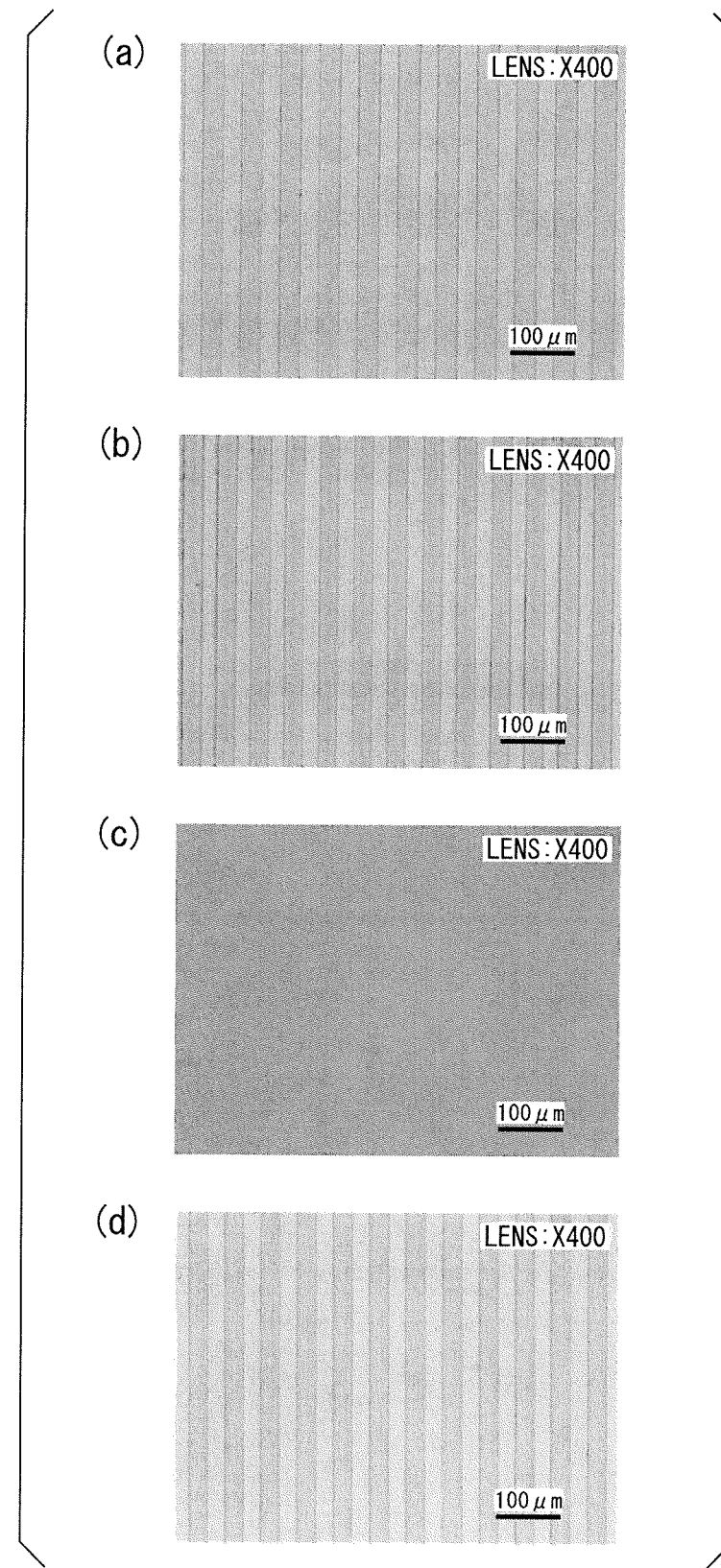
FIG. 7 shows photographs showing the results of Example 1.

FIG. 7 shows optical microscope images of insulator layers after the development. FIG. 7(a) shows a result when raw material solution 1 was used. FIG. 7(b) shows a result when raw material solution 2 was used. FIG. 7(c) shows a result when raw material solution 3 was used. FIG. 7(d) shows a result when raw material solution 4 was used.

As shown in FIG. 7, in a case where raw material solution 1 was used, in a case where raw material solution 2 was used, and in a case where raw material solution 4 was used, it was possible to obtain a good pattern having a width of 30 μm for all cases. On the other hand, in a case where raw material solution 3 using tetraphenylol ethane glycidyl ether as the first cross-linking agent, it was impossible to perform the development by the aqueous TMAH solution at all, and it was impossible to obtain a pattern.

Example 2

Figure 8A:
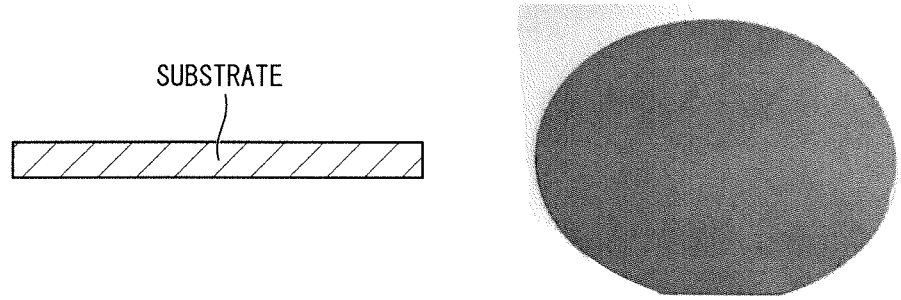
FIG. 8A is a view showing a manufacturing process of a sandwich cell evaluated in Example 2.
Figure 8B:
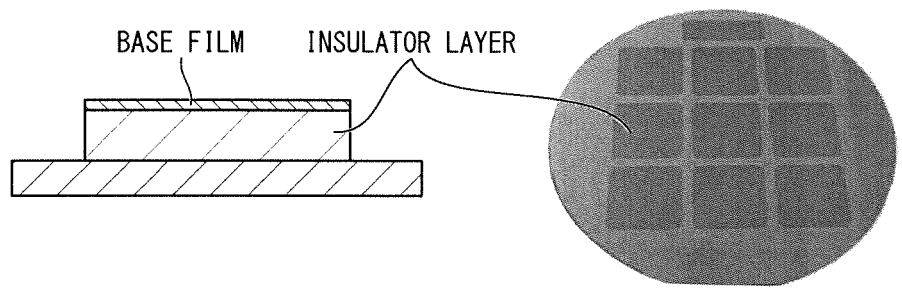
FIG. 8B is a view showing the manufacturing process of the sandwich cell evaluated in Example 2.
Figure 8C:
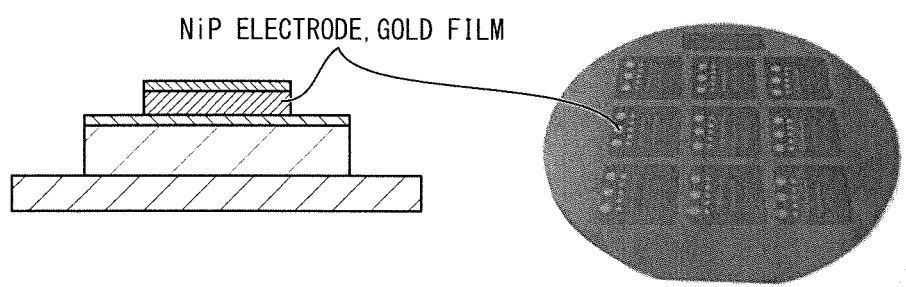
FIG. 8C is a view showing the manufacturing process of the sandwich cell evaluated in Example 2.

FIGS. 8A to 8C are views showing a process of manufacturing the sandwich cell evaluated in Example 2.

First, an insulator layer and a base film were laminated (refer to FIG. 8B) on a silicon substrate (n-type abrasive product, ≤0.003 Ω cm, manufactured by Nakayama Semiconductor Co., Ltd.) (refer to FIG. 8A) by the following method.

Specifically, raw material solution 2 of Example 1 described above was applied onto the silicon substrate by spin coating (1000 rpm×30 seconds). Then, the substrate was heated at 105° C. for 5 minutes to volatilize cyclohexanone (solvent), and a coating film of a curable composition was formed on the silicon substrate.

Next, the coating film was irradiated with i-line ray (365 nm) at an irradiation intensity of 700 mJ/cm$^2$ through a photomask, was further heated (post-baked) at 120° C. for 10 minutes, and then immersed in 2.38 mass % of an aqueous TMAH solution for 1 minute to be developed, so as to form an insulator layer.

The surface of the formed insulator layer was cleaned with atmospheric-pressure oxygen plasma, and then a silane coupling agent, which is a formation material of a base film for electroless plating, was formed into a film. In the present Example, as the silane coupling agent, 3-aminopropyltriethoxysilane having a primary amino group (KBE-903, manufactured by Shin-Etsu Silicone Co., Ltd.) was used. The silane coupling agent was dissolved in methyl isobutyl ketone to have a content of 0.2 mass % to obtain a liquid product, and then the liquid product was applied onto the substrate by spin coating (4000 rpm×30 seconds). Thereafter, the substrate coated with the liquid product was heated at 120° C. for 5 minutes to volatilize methyl isobutyl ketone (solvent), so as to form a base film.

Then, hexamethyldisiloxane (hereinafter, sometimes referred to as "HMDS") was applied onto the surface of the base film by spin coating (2000 rpm×30 seconds) and was heated at 120° C. for 5 minutes.

Next, as shown in FIG. 8C, an upper electrode was formed on the base film, and a sandwich cell was fabricated.

Specifically, a photoresist (SUMIRESIST PFI-34A, manufactured by Sumitomo Chemical Co., Ltd.) was applied to the surface of the base film coated with HMDS by spin coating (1000 rpm×30 seconds), and heated at 90° C. for 5 minutes, so as to form a resist layer.

Next, the resist layer was irradiated with light emitted from a low-pressure mercury lamp through a quartz photomask for 5 minutes, heated (post-baked) at 110° C. for 5 minutes, and then immersed into 2.38 mass % of an aqueous TMAH solution for 90 seconds to thereby develop the resist layer, so as to form an opening in the resist layer.

Next, the substrate provided with the resist layer having the opening was washed with water at room temperature for 30 seconds, and then immersed into a catalyst colloid solution for electroless plating (Melplate activator 7331, manufactured by Meltex Corporation) at room temperature for 60 seconds, so as to adhere a catalyst to the base film exposed through the opening of the resist layer.

Next, the surface of the base film was washed with water, and then immersed into an electroless plating solution (Melplate NI-867, manufactured by Meltex Corporation) at 70° C. for 180 seconds to deposit nickel phosphorus on the catalyst adhered to the opening of the resist layer, so as to perform nickel-phosphorus plating.

Next, the surface of the nickel-phosphorus plated portion (NiP electrode) was washed with water, and then immersed into a gold plating bath for substitution for 1 minute and further immersed into a plating bath for reduction for 3 minutes to thereby perform electroless gold plating on the upper surface of the NiP electrode and coat the upper surface of the NiP electrode with gold, so as to fabricate an upper electrode.

Next, the surface of the upper electrode was water-washed and then dried. Then, the entire surface including the remaining resist layer was irradiated with i-line ray at an irradiation intensity of 300 mJ/cm$^2$, and then immersed into 2.38 mass % of an aqueous TMAH solution to remove the resist layer. The resulting product was water-washed and dried to thereby fabricate a sandwich cell.

The dielectric constant and insulation characteristics of the insulator layer were measured using the fabricated sandwich cell by the following method.

(Dielectric Constant)

The measurement of capacitance of the fabricated insulator layer was performed in a frequency range of 100 Hz to 1 MHz using an LCR meter (4284A, manufactured by Agilent Technologies).

Figure 9:
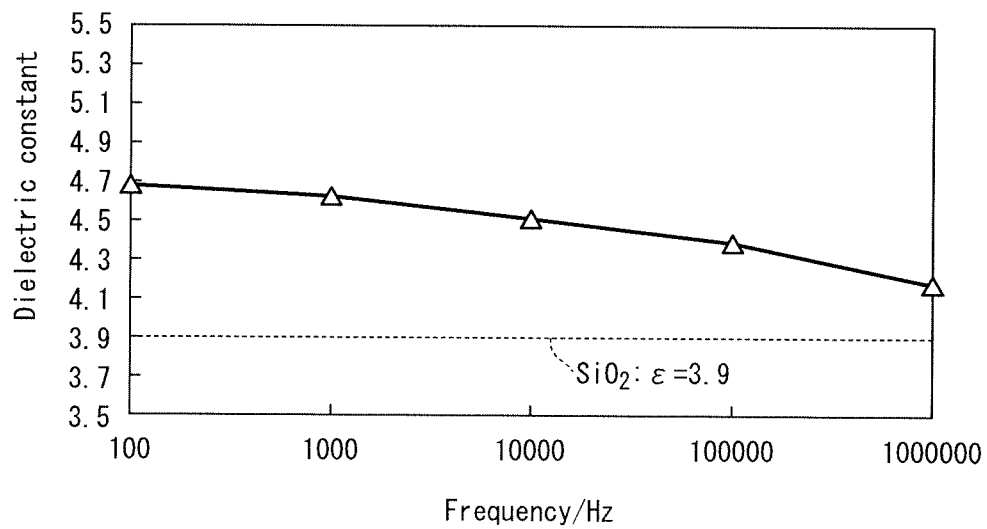
FIG. 9 is a graph showing the frequency dependence of dielectric constant of an insulator layer of Example 2.

FIG. 9 is a graph showing the frequency dependency of dielectric constant calculated from capacitance of the insulator layer of the fabricated sandwich cell. In the graph of FIG. 9, the horizontal axis indicates the measurement frequency (unit: Hz), and the vertical axis indicates the measured dielectric constant.

It was found that the insulator layer fabricated in Example 2 had a high dielectric constant greater than ε=3.9, which is a dielectric constant of a SiO$_2$ thermal oxide film (generally known inorganic insulator), with respect to any measurement frequency.

(Insulating Characteristics)

In the evaluation of insulating characteristics of the fabricated insulator layer, current density was measured using the Semiconductor Characterization System (4200-SCS, manufactured by KEITHLEY Co., Ltd.) when a voltage of 0 MV/cm to 2 MV/cm was applied.

Figure 10:
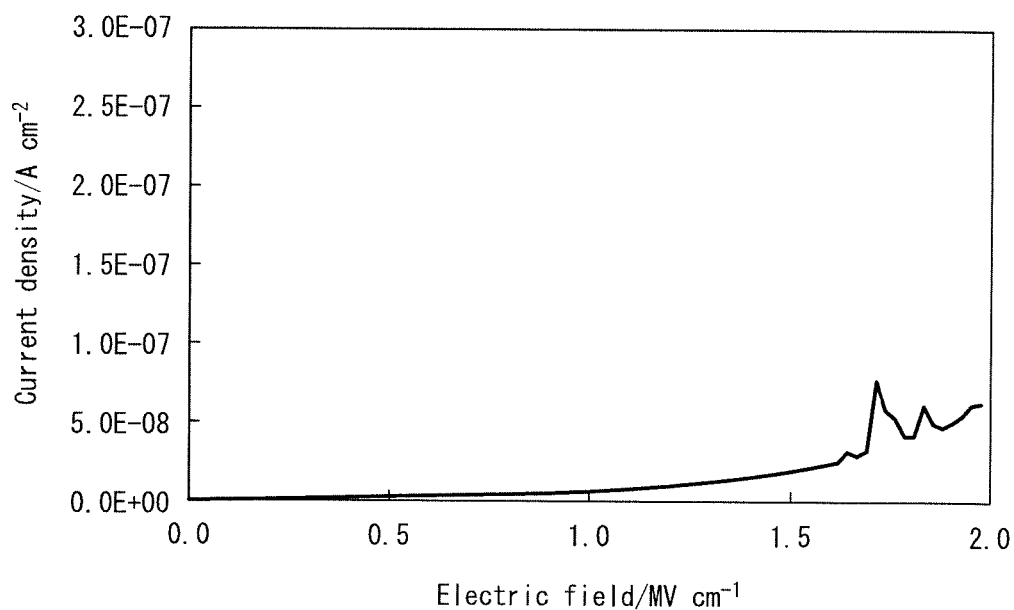
FIG. 10 is a graph showing an evaluation result of insulating property of the insulator layer of Example 2.

FIG. 10 is a graph showing the evaluation result of insulating characteristics of the insulator layer of the fabricated sandwich cell. In the graph of FIG. 10, the horizontal axis indicates the measurement voltage (unit: MV/cm), and the vertical axis indicates the measured current density ($A/cm^2$).

Most of general resin-based insulators have a current density on the order of $1\times10^{-7}$ $A/cm^2$. On the other hand, it was found that the current density of the insulator layer fabricated in Example 2 was a value on the order of $1\times10^{-8}$ $A/cm^2$ with respect to any measurement voltage and the insulator layer had improved insulation properties.

Example 3

(Fabrication of Gate Electrode)

In Example 3, 3-aminopropyltriethoxysilane (KBE 903, manufactured by Shin-Etsu Silicone Co., Ltd.), which is an amine-based silane coupling agent, was dissolved in methyl isobutyl ketone (hereinafter, sometimes referred to as MIBK) to have 0.2 mass % to prepare a liquid product, and this liquid product was used in forming a base film.

The surface of a PET substrate (Model number: A-4100 (no coat), manufactured by Toyobo Co., Ltd.) was cleaned with atmospheric-pressure oxygen plasma, and then the above liquid product was applied onto the PET substrate by spin coating (4000 rpm×30 seconds). Thereafter, the PET substrate coated with the liquid product was heated at 120° C. for 10 minutes, so as to form a base film.

Next, a resist material (SUMIRESIST PFI-34A6, manufactured by Sumitomo Chemical Co., Ltd.) was applied to the surface of the substrate provided with the base film by spin coating, and then heated (prebaked) at 90° C. for 5 minutes, so as to form a resist layer. The spin coating was performed under a condition of 1000 rpm and 30 seconds, and a resist layer having a thickness of about 1 μm was formed.

Next, the resist layer was exposed with ultraviolet having an intensity of 25 $mW/cm^2$ through a photomask for 5 seconds, heated (post-baked) at 110° C. for 5 minutes, and then immersed into 2.38 mass % of an aqueous TMAH solution for 2 minutes to thereby develop a mask pattern on the resist layer, so as to form an opening.

Next, the substrate provided with the resist layer having the opening was ultrasonically water-washed at room temperature for 30 seconds, and then immersed into a catalyst colloid solution for electroless plating (Melplate activator 7331, manufactured by Meltex Corporation) at room temperature for 60 seconds, so as to adhere a catalyst (Pd metal) to the base film exposed through the opening of the resist layer.

Next, the surface of the base film was washed with water, and then immersed into an electroless plating solution (Melplate NI-867, manufactured by Meltex Corporation) at 73° C. for 60 seconds to deposit nickel phosphorus on the catalyst adhered to the opening of the resist layer, so as to perform nickel-phosphorus plating.

Next, the surface of the resulting product was water-washed and then dried. Then, the entire surface including the remaining resist layer was exposed to ultraviolet having an intensity of 25 $mW/cm^2$ for 1 minute, and then immersed into ethanol for 1 minute to thereby remove the resist layer, so as to fabricate a gate electrode.

Figure 11:
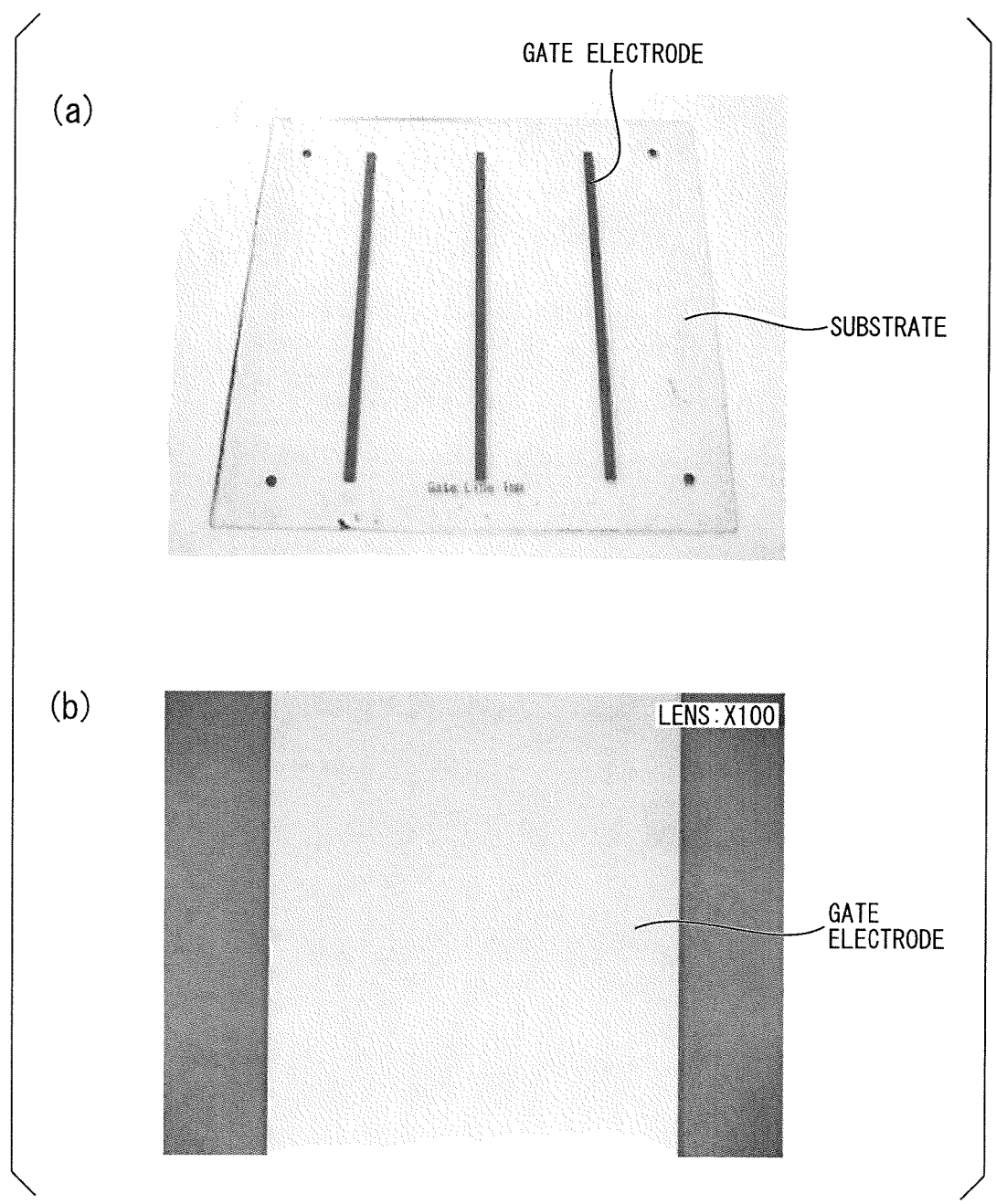
FIG. 11 shows photographs showing the results of Example 3.

FIG. 11 shows photographs of the gate electrode. FIG. 11(a) is an overall photograph of the substrate provided with the gate electrode. FIG. 11(b) is an enlarged photograph of the gate electrode using an optical microscope. From FIG. 11, it is found that a slightly uneven flat gate electrode is formed.

(Fabrication of Insulator Layer)

In order to improve the adhesiveness between the gate electrode and the insulator layer to be formed, the substrate provided with the gate electrode was immersed into an aqueous NaOH solution of 50 g/L, and a degreasing process of the surface was performed.

Next, an aqueous solution of a silane coupling agent (3-glycidoxypropyl triethoxysilane, KBM-403, manufactured by Shin-Etsu Silicone Co., Ltd.) was applied to the whole surface, on which the gate electrode was formed, of the PET substrate by spin coating, and the substrate was heated at 120° C. for 10 minutes. Thereafter, the raw material solution 2 of Example 1 was applied onto the surface by spin coating (1000 rpm×30 seconds). Then, the resulting product was heated at 105° C. for 5 minutes to volatilize cyclohexanone (solvent), so as to form a coating film of a curable composition.

Next, the coating film was irradiated with ultraviolet for 25 seconds through a mask having an opening in the portion forming an insulator layer. In order to accelerate curing, the ultraviolet-irradiated coating film was heated at 120° C. for 10 minutes, and then immersed into 2.38 mass % of an aqueous TMAH solution for 1 minute to form a patterned film. Then, the patterned film was heat-treated at 120° C. for 30 minutes to form an insulator layer.

Figure 12:
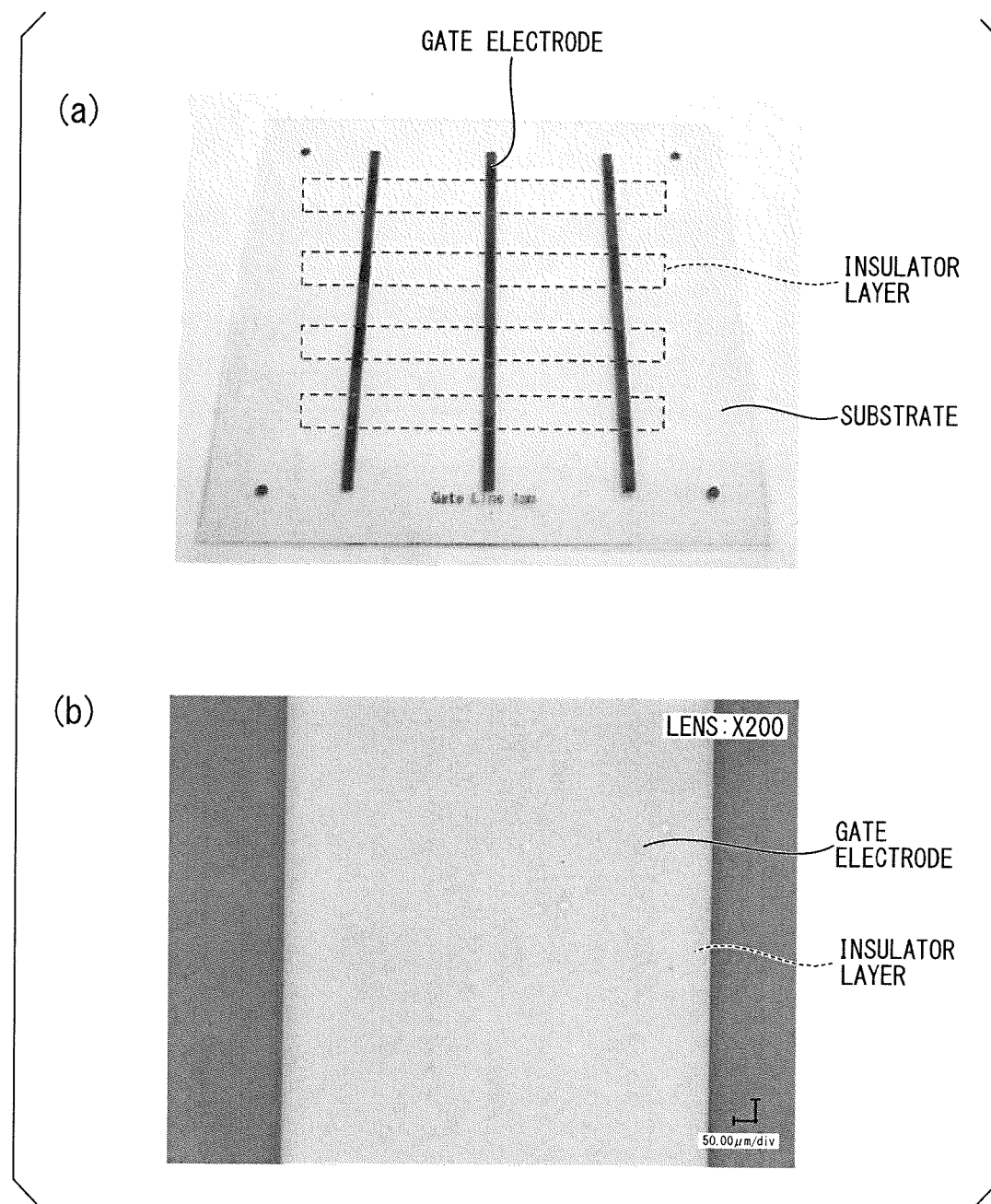
FIG. 12 shows photographs showing the results of Example 3.

FIG. 12 is a photograph of the insulator layer. FIG. 12(a) is an overall photograph of the substrate provided with the insulator layer. FIG. 12(b) is an enlarged photograph of the insulator layer of the region surrounded by the dash line of FIG. 12(a). As a result of the observation, it was confirmed that the insulator layer was formed without unevenness and a slightly uneven flat insulator layer was formed by development with an alkaline solution.

(Fabrication of Source and Drain Electrodes)

Next, the fabrication and electroless plating of the base film and the resist layer were performed on the entire surface of the side where the insulator layer was formed on the PET substrate in the same manner as the above-mentioned process (fabrication of the gate electrode), so as to form a patterned NiP electrode on the insulator layer. The NiP electrode corresponds to the first electrode and the third electrode described in the embodiment.

In addition, after stripping the resist, the NiP electrode was immersed into a gold plating bath for substitution for 1 minute and further immersed into a plating bath for reduction for 3 minutes to thereby perform electroless gold plating to coat the surface of the NiP electrode with gold, so as to fabricate a source electrode and a drain electrode. The gold film coating the surface of the NiP electrode corresponds to the second electrode and the fourth electrode described in the embodiment.

Figure 13:
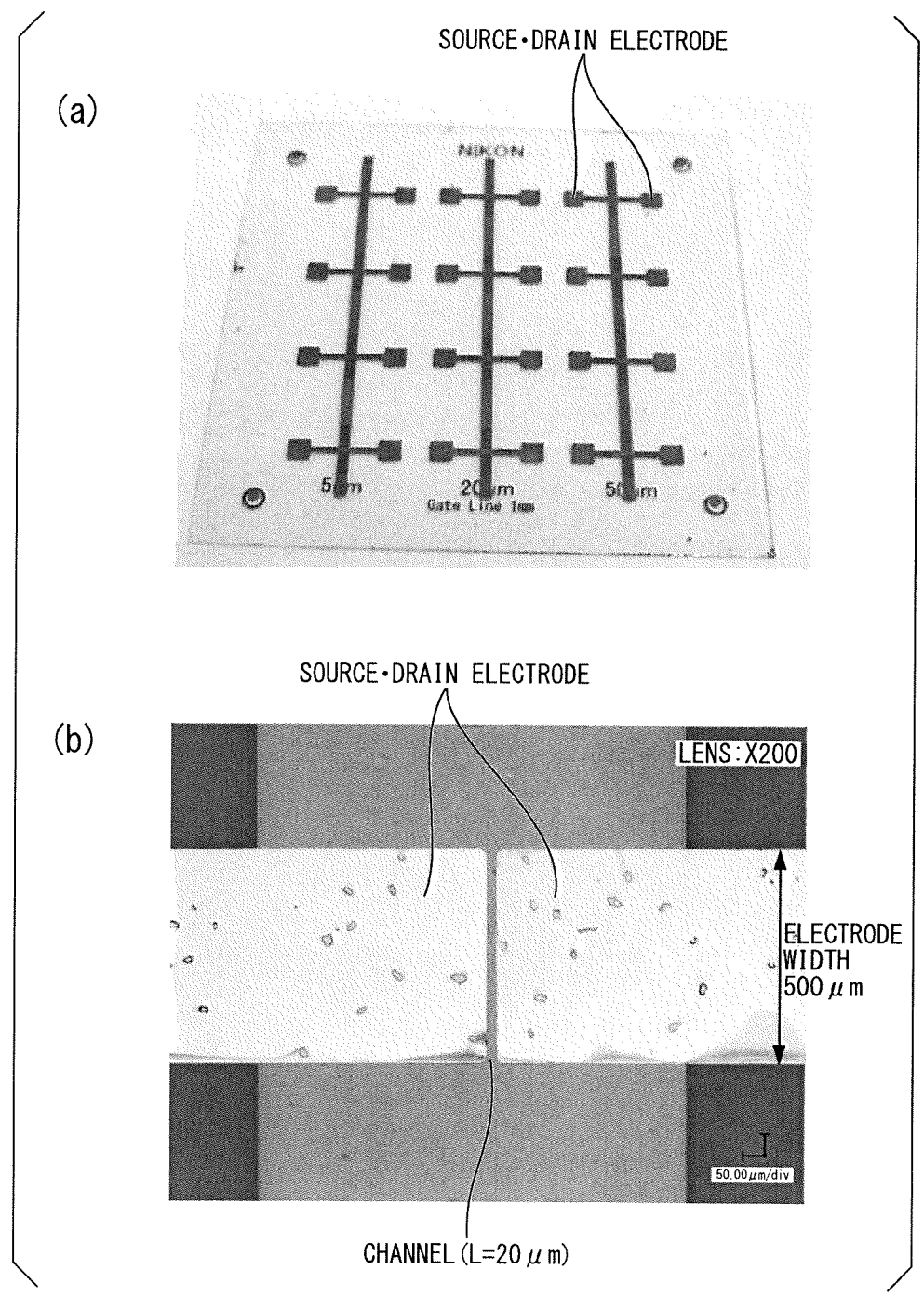
FIG. 13 shows photographs showing the results of Example 3.

FIG. 13 shows the photographs of the source electrode and the drain electrode. FIG. 13(a) is an overall photograph of the substrate provided with the source electrode and the drain electrode. FIG. 13(b) is an enlarged photograph of the source electrode and the drain electrode. As a result of the observation, in the surface of the insulator layer of the present invention, it was confirmed that a good source electrode and a good drain electrode were formed. Further, damage to the insulator layer in the electroless plating process was not confirmed.

(Fabrication of Organic Semiconductor Layer)

A toluene solution of 6,13-bis(triisopropylsilylethynyl) pentacene (TIPS pentacene) (716006, manufactured by Sigma-Aldrich, Inc.) was dropped between the source electrode and the drain electrode under a nitrogen atmosphere, and naturally dried to thereby form a semiconductor layer, so as to fabricate a transistor. Here, the adjustment of the TIPS pentacene/toluene solution used was also performed under a nitrogen atmosphere.

Figure 14:
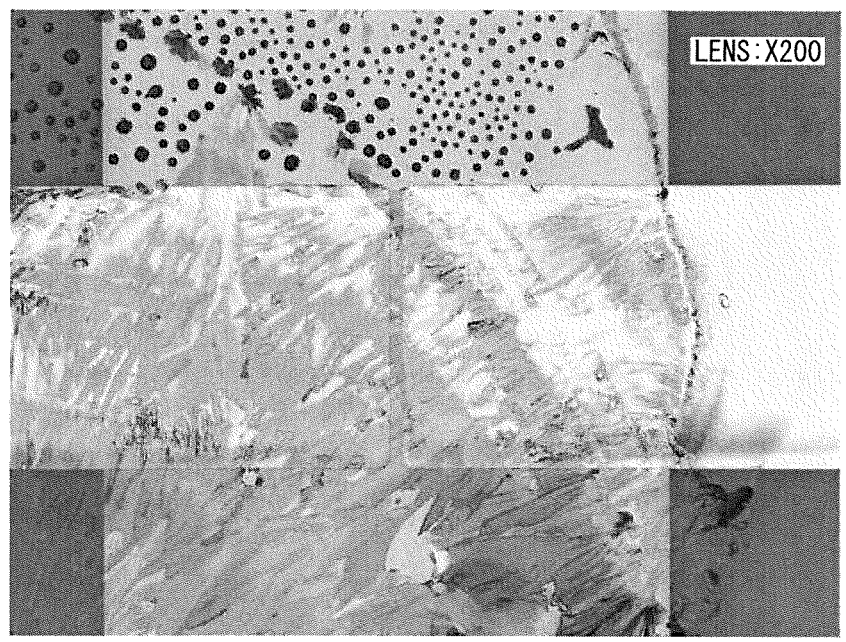
FIG. 14 shows a photograph showing the result of Example 3.

FIG. 14 shows an enlarged photograph of the source electrode and the drain electrode having the surface provided with the organic semiconductor layer. It was observed that crystals of TIPS pentacene were formed between the source electrode and the drain electrode.

(Evaluation of Transistor)

The transistor characteristics of the fabricated transistor were evaluated using the Semiconductor Characterization System (4200-SCS, manufactured by KEITHLEY Co., Ltd.).

Figure 15:
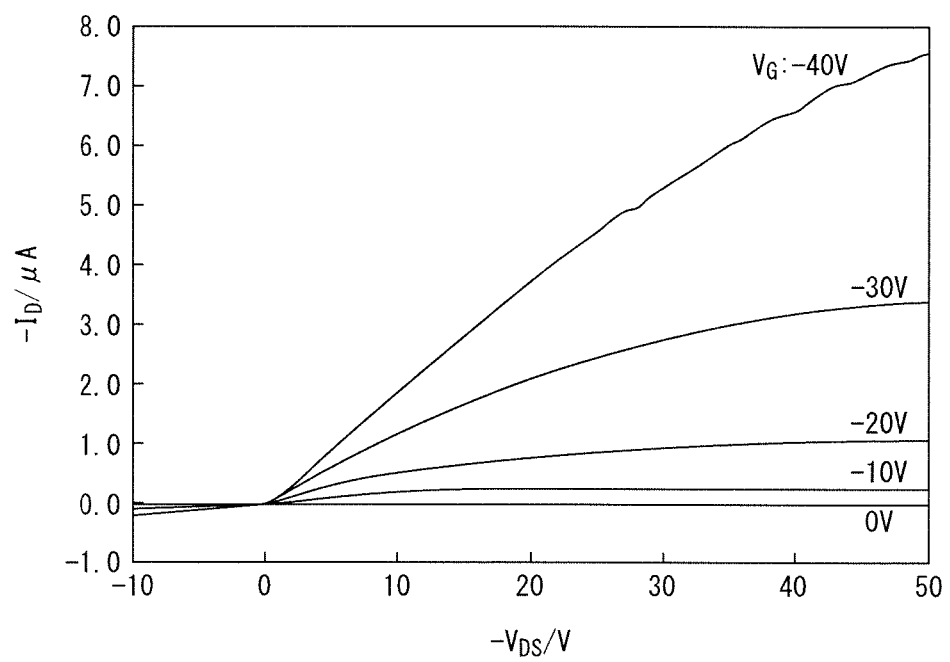
FIG. 15 shows a graph showing the result of Example 3.

FIG. 15 shows a graph showing the transistor characteristics of the transistor fabricated by a wet process using the above-mentioned method. In the graph of FIG. 15, the horizontal axis indicates a voltage applied between the source electrode and the drain electrode, and the vertical axis indicates a current value detected by the drain electrode. One of the plurality of results shown in FIG. 15 corresponds to each of the gate voltages applied to a gate electrode.

A gate voltage of 0 V to −40 V was applied to the gate electrode of the obtained organic thin film transistor, and a voltage of 0 V to −50 V was applied between source and drain to flow electric current. As a result, as shown in FIG. 15, holes are induced in the channel region (between source and drain) of a semiconductor layer, and the fabricated transistor was operated as a p-type transistor.

From the above results, it was found that, when a composition according to the aspect of the present invention was used to form an insulator layer by development with an alkaline solution, it was possible to fabricate a transistor (organic thin film transistor) in an all wet process. Further, it was found that, when the base film was formed using a silane coupling agent (primary amine), the treatment using an accelerator was not required, and the operation of electroless plating was simplified. Further, it was found that, since the base film formed using a silane coupling agent was a flat film having very small unevenness, at the time of forming a laminated structure, uneven shape was not imparted to the configuration of the upper layer of the base film, and it was possible to fabricate a high-performance transistor. Moreover, it was found that, since it was possible to coat the entire surface of source and drain electrodes with a metal material having a work function that provides a small energy gap with HOMO of the formation material of the organic semiconductor layer by using an electroless plating method, it was possible to provide a transistor having small electrical contact resistance between the organic semiconductor layer and the source and drain electrodes.

From the above results, the usefulness of the present invention has been confirmed.

What is claimed is:

1. A method of manufacturing a laminate for a transistor including a source electrode and a drain electrode, a gate electrode provided corresponding to a channel between the source electrode and the drain electrode, a semiconductor layer provided in contact with the source electrode and the drain electrode, and an insulator layer disposed between the source electrode and the gate electrode and between the drain electrode and the gate electrode, wherein the insulator layer is formed by cationic polymerization of a composition and wherein at least one of the gate electrode, the source electrode, and the drain electrode is laminated on a base film containing a silane coupling agent having a group capable of capturing a metal, which is an electroless plating catalyst, the method comprising:

applying a solution, containing the composition comprising an organic compound having a hydroxy group, a first cross-linking agent that is at least one organic silicon compound selected from the group including an organic silicon compound including one siloxane bond in the molecule and having three or more cyclic ether groups in the molecule, a chain organic silicon compound including two or more siloxane bonds in the molecule and having two or more cyclic ether groups in the molecule, a cyclic organic silicon compound including a siloxane unit (D unit) represented by $R^1R^2SiO_{2/2}$ in the molecule, both of $R^1$ and $R^2$ being a cyclic ether group, and having four or more cyclic ether groups bonded to a silicon atom of the D unit in the molecule, and a cyclic organic silicon compound including a siloxane unit (T unit) represented by $R^3SiO_{3/2}$ in the molecule, $R^3$ being a cyclic ether group, and having two or more cyclic ether groups in the molecule; and a photocationic polymerization initiator, over a conductive layer to form a coating film;

selectively irradiating the coating film with light including light having an absorption wavelength of the photocationic polymerization initiator included in the coating film to form a latent image in the light-irradiated region of the coating film; and developing the coating film with an alkaline solution to form the insulator layer.

2. The method of manufacturing a laminate according to claim 1, further comprising:

prior to forming the coating film, applying a surface treatment on at least a region to be provided with the coating film by using a silane coupling agent having a cyclic ether group.

3. A method of manufacturing a transistor, comprising:

forming a gate electrode on a substrate;

applying a solution, including a composition comprising an organic compound having a hydroxy group, a first cross-linking agent that is at least one organic silicon compound selected from the group including an organic silicon compound including one siloxane bond in the molecule and having three or more cyclic ether groups in the molecule, a chain organic silicon compound including two or more siloxane bonds in the molecule and having two or more cyclic ether groups in the molecule, a cyclic organic silicon compound including a siloxane unit (D unit) represented by $R^1R^2SiO_{2/2}$ in the molecule, both of $R^1$ and $R^2$ being a cyclic ether group, and having four or more cyclic ether groups bonded to a silicon atom of the D unit in the molecule, and a cyclic organic silicon compound including a siloxane unit (T unit) represented by $R^3SiO_{3/2}$ in the molecule, $R^3$ being a cyclic ether group, and having two or more cyclic ether groups in the molecule and a photocationic polymerization initiator, over the gate electrode to form a coating film;

selectively irradiating the coating film with light including light having an absorption wavelength of a photocationic polymerization initiator included in the coating film to form a latent image in the light-irradiated region of the coating film;

developing the coating film with an alkaline solution to form an insulator layer; and forming a source electrode and a drain electrode on the surface of a layer including the insulator layer, wherein the gate electrode is provided corresponding to a channel between the source electrode and the drain electrode, wherein a semiconductor layer is provided in contact with the source electrode and the drain electrode, wherein cationic polymerization of the composition forms an insulator layer disposed between the source electrode and the gate electrode and between the drain electrode and the gate electrode, and wherein at least one of the gate electrode, the source electrode, and the drain electrode is laminated on a base film containing a silane coupling agent having a group capable of capturing a metal, which is an electroless plating catalyst.

4. The method of manufacturing a transistor according to claim 3, further comprising:

prior to forming the coating film, applying a surface treatment on at least a region to be provided with the coating film by using a first silane coupling agent having a cyclic ether group.

5. The method of manufacturing a transistor according to claim 3, wherein at least one of the gate electrode, the source electrode, and the drain electrode is formed by:

applying a formation material containing a second silane coupling agent having a group capable of capturing a metal, which is an electroless plating catalyst, to form a base film; and capturing the metal on the surface of the base film and then performing electroless plating.

6. The method of manufacturing a transistor according to claim 5, wherein the source electrode and the drain electrode are formed by:

forming a source base film and a drain base film, each being the base film; and then capturing the metal on the surface of each of the source base film and the drain base film to perform electroless plating.

7. The method of manufacturing a transistor according to claim 6, wherein the source base film and the drain base film are formed as a continuous film.

8. The method of manufacturing a transistor according to claim 5, wherein the gate electrode is formed by forming a gate base film, which is the base film, and then capturing the metal on the surface of the gate base film to perform electroless plating.

9. The method of manufacturing a transistor according to claim 5, wherein the second silane coupling agent has an amino group.

10. The method of manufacturing a transistor according to claim 9, wherein the second silane coupling agent is a primary amine or a secondary amine.

11. The method of manufacturing a transistor according to claim 5, wherein the layer including the insulator layer includes: the insulator layer; and an organic semiconductor layer disposed on the insulator layer and having a surface on which the source electrode and the drain electrode are formed.

12. The method of manufacturing a transistor according to claim 11, comprising, prior to forming the source electrode and the drain electrode:

forming a resist layer having an opening corresponding to the source electrode and the drain electrode and capturing the metal on the surface of the base film formed on the surface exposed at least in the opening;

performing first electroless plating and then removing the resist layer; and performing second electroless plating on the surface of an electrode formed by the first electroless plating to form the source electrode and the drain electrode, wherein the energy level difference between the work function of a metal material used in the second electroless plating and the energy level of a molecular orbital used for electron transfer in a formation material of the organic semiconductor layer is smaller than the energy level difference between the work function of a metal material used in the first electroless plating and the energy level of the molecular orbital.

13. The method of manufacturing a transistor according to claim 5, comprising:

forming the source electrode and the drain electrode; and then forming an organic semiconductor layer that is in contact with surfaces of the source electrode and the drain electrode that face each other.

14. The method of manufacturing a transistor according to claim 3, wherein the substrate is made of a non-metallic material.

15. The method of manufacturing a transistor according to claim 14, wherein the substrate is made of a resin material.

16. The method of manufacturing a transistor according to claim 15, wherein the substrate has flexibility.

17. A transistor, comprising:

a source electrode and a drain electrode;

a gate electrode provided corresponding to a channel between the source electrode and the drain electrode;

a semiconductor layer provided in contact with the source electrode and the drain electrode; and an insulator layer disposed between the source electrode and the gate electrode and between the drain electrode and the gate electrode, wherein the insulator layer is formed by cationic polymerization of a composition comprising an organic compound having a hydroxy group, a first cross-linking agent that is at least one organic silicon compound selected from the group including an organic silicon compound including one siloxane bond in the molecule and having three or more cyclic ether groups in the molecule, a chain organic silicon compound including two or more siloxane bonds in the molecule and having two or more cyclic ether groups in the molecule, a cyclic organic silicon compound including a siloxane unit (D unit) represented by $R^1R^2SiO_{2/2}$ in the molecule, both of $R^1$ and $R^2$ being a cyclic ether group, and having four or more cyclic ether groups bonded to a silicon atom of the D unit in the molecule, and a cyclic organic silicon compound including a siloxane unit (T unit) represented by $R^3SiO_{3/2}$ in the molecule, $R^3$ being a cyclic ether group, and having two or more cyclic ether groups in the molecule, and a photocationic polymerization initiator, and wherein at least one of the gate electrode, the source electrode, and the drain electrode is laminated on a base film containing a silane coupling agent having a group capable of capturing a metal, which is an electroless plating catalyst.

18. The transistor according to claim 17,
wherein the semiconductor layer is an organic semiconductor layer.

19. The transistor according to claim 18,
wherein the source electrode has a first electrode and a second electrode formed to cover the first electrode;
the drain electrode has a third electrode and a fourth electrode formed to cover the third electrode;
the energy level difference between the work function of a formation material of the second electrode and the energy level of a molecular orbital used for electron transfer in a formation material of the organic semiconductor layer is smaller than the energy level difference between the work function of a formation material of the first electrode and the energy level of the molecular orbital; and
the energy level difference between the work function of a formation material of the fourth electrode and the energy level of the molecular orbital used for electron transfer in the formation material of the organic semiconductor layer is smaller than the energy level difference between the work function of a formation material of the third electrode and the energy level of the molecular orbital.

20. The transistor according to claim 17, which is formed on a substrate made of a non-metallic material.

21. The transistor according to claim 20,
wherein the substrate is made of a resin material.

22. The transistor according to claim 21,
wherein the substrate has flexibility.

23. A transistor, comprising:
a source electrode and a drain electrode;
a gate electrode provided corresponding to a channel between the source electrode and the drain electrode;
a semiconductor layer provided in contact with the source electrode and the drain electrode; and
an insulator layer disposed between the source electrode and the gate electrode and between the drain electrode and the gate electrode,
wherein the insulator layer is formed by cationic polymerization of a composition comprising
an organic compound having a hydroxy group,
a first cross-linking agent that is at least one organic silicon compound selected from the group including
an organic silicon compound including one siloxane bond in the molecule and having three or more cyclic ether groups in the molecule,
a chain organic silicon compound including two or more siloxane bonds in the molecule and having two or more cyclic ether groups in the molecule,
a cyclic organic silicon compound including a siloxane unit (D unit) represented by R1R2SiO2/2 in the molecule, both of R1 and R2 being a cyclic ether group, and having four or more cyclic ether groups bonded to a silicon atom of the D unit in the molecule, and
a cyclic organic silicon compound including a siloxane unit (T unit) represented by R3SiO3/2 in the molecule, R3 being a cyclic ether group, and having two or more cyclic ether groups in the molecule, and
a photocationic polymerization initiator, and
wherein
the semiconductor layer is an organic semiconductor layer,
the source electrode has a first electrode and a second electrode formed to cover the first electrode,
the drain electrode has a third electrode and a fourth electrode formed to cover the third electrode,
the energy level difference between the work function of a formation material of the second electrode and the energy level of a molecular orbital used for electron transfer in a formation material of the organic semiconductor layer is smaller than the energy level difference between the work function of a formation material of the first electrode and the energy level of the molecular orbital, and
the energy level difference between the work function of a formation material of the fourth electrode and the energy level of the molecular orbital used for electron transfer in the formation material of the organic semiconductor layer is smaller than the energy level difference between the work function of a formation material of the third electrode and the energy level of the molecular orbital.

24. The transistor according to claim 23, which is formed on a substrate made of a non-metallic material.

25. The transistor according to claim 24, wherein the substrate is made of a resin material.

26. The transistor according to claim 25, wherein the substrate has flexibility.

* * * * *

UNITED STATES PATENT AND TRADEMARK OFFICE
CERTIFICATE OF CORRECTION

PATENT NO. : 10,510,460 B2
APPLICATION NO. : 15/599078
DATED : December 17, 2019
INVENTOR(S) : Shohei Koizumi et al.

Page 1 of 1

It is certified that error appears in the above-identified patent and that said Letters Patent is hereby corrected as shown below:

In the Claims

Column 32, Line 10:
Claim 23, delete "R1R2SiO2/2" and insert -- $R^1R^2SiO_{2/2}$ --, therefor.

Column 32, Line 11:
Claim 23, after "both of" delete "R1 and R2" and insert -- $R^1$ and $R^2$ --, therefor.

Column 32, Line 16:
Claim 23, delete "R3SiO3/2" and insert -- $R^3SiO_{3/2}$ --, therefor.

Column 32, Line 17:
Claim 23, after "molecule," delete "R3" and insert -- $R^3$ --, therefor.

Signed and Sealed this
Third Day of March, 2020

Andrei Iancu
*Director of the United States Patent and Trademark Office*